(12) United States Patent
Kajino et al.

(10) Patent No.: US 11,349,062 B2
(45) Date of Patent: May 31, 2022

(54) PIEZOELECTRIC DRIVE DEVICE, ROBOT, AND PRINTER

(71) Applicant: Seiko Epson Corporation, Tokyo (JP)

(72) Inventors: Kiichi Kajino, Matsumoto (JP); Tomoaki Takahashi, Matsumoto (JP); Akio Konishi, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 378 days.

(21) Appl. No.: 16/556,273

(22) Filed: Aug. 30, 2019

(65) Prior Publication Data

US 2020/0075835 A1 Mar. 5, 2020

(30) Foreign Application Priority Data

Aug. 31, 2018 (JP) .............................. JP2018-163087

(51) Int. Cl.
| | |
|---|---|
| *H01L 41/047* | (2006.01) |
| *H02N 2/04* | (2006.01) |
| *B25J 9/12* | (2006.01) |
| *H01L 41/04* | (2006.01) |
| *H02N 2/10* | (2006.01) |
| *H01L 41/09* | (2006.01) |
| *H02N 2/00* | (2006.01) |
| *H02N 2/14* | (2006.01) |
| *H02P 25/032* | (2016.01) |

(52) U.S. Cl.
CPC ............ *H01L 41/0471* (2013.01); *B25J 9/12* (2013.01); *H01L 41/042* (2013.01); *H01L 41/09* (2013.01); *H02N 2/001* (2013.01); *H02N 2/04* (2013.01); *H02N 2/103* (2013.01); *H02N 2/14* (2013.01); *H02P 25/032* (2016.02)

(58) Field of Classification Search
CPC ... H01L 41/0471; H01L 41/042; H01L 41/09; H02N 2/001; H02N 2/04; H02N 2/103; H02N 2/14
USPC ........................................ 310/323.01–323.21
See application file for complete search history.

(56) References Cited

U.S. PATENT DOCUMENTS

| | | | | |
|---|---|---|---|---|
| 2007/0188048 | A1* | 8/2007 | Nagahama | ............... G04C 3/12 310/316.01 |
| 2007/0188050 | A1* | 8/2007 | Hashimoto | ......... H01L 41/0913 310/323.02 |
| 2017/0001306 | A1* | 1/2017 | Arakawa | ............... H01L 41/042 |

FOREIGN PATENT DOCUMENTS

JP          2009-284375 A      12/2009

* cited by examiner

*Primary Examiner* — Derek J Rosenau
(74) *Attorney, Agent, or Firm* — Gang Yu

(57) ABSTRACT

A piezoelectric drive device includes a vibrating part, and a control unit that controls vibration of the vibrating part, wherein the vibrating part includes a piezoelectric material having a first surface and a second surface in a front-back relation, a drive electrode having a first electrode arranged at the first surface and a second electrode arranged at the second surface, and vibrating the piezoelectric material when a drive signal from the control unit is input to the second electrode, and a detection electrode having a third electrode arranged at the first surface and a fourth electrode arranged at the second surface, and outputting a detection signal according to the vibration of the piezoelectric material to the control unit via the fourth electrode, and the first electrode and the third electrode are separated on the first surface, and the second electrode and the fourth electrode are separated on the second surface.

9 Claims, 15 Drawing Sheets

PIEZOELECTRIC DRIVE DEVICE, ROBOT, AND PRINTER

The present application is based on, and claims priority from, JP Application Serial Number 2018-163087, filed Aug. 31, 2018, the disclosure of which is hereby incorporated by reference herein in its entirety.

BACKGROUND

1. Technical Field

The present disclosure relates to a piezoelectric drive device, robot, and printer.

2. Related Art

A vibrator disclosed in JP-A-2009-284375 is a vibrator that may detect adhesion of minute materials, viscosity changes of liquids, or the like by oscillating the vibrator in a principal vibration mode having constant frequency and amplitude. The vibrator includes a substrate, a foundation electrode formed on a thin portion of the substrate, a piezoelectric layer formed on the foundation electrode, and a drive electrode and a detection electrode formed on the piezoelectric layer. In the vibrator, as seen from a thickness direction of the piezoelectric layer, the foundation electrode is placed to overlap with both the drive electrode and the detection electrode. That is, the foundation electrode is a counter electrode in common with both the drive electrode and the detection electrode.

In the vibrator disclosed in JP-A-2009-284375, as described above, the foundation electrode opposed to the drive electrode and the foundation electrode opposed to the detection electrode are common. Accordingly, when a voltage is applied between the drive electrode and the foundation electrode and a current flows between the drive electrode and the foundation electrode, noise contained in the current is superimposed on a waveform of a potential difference generated between the detection electrode and the foundation electrode via the foundation electrode. Accordingly, the waveform of the potential difference with the noise superimposed thereon is extracted from the detection electrode. As a result, there is a problem that, when amplitude and phase are acquired from the extracted potential difference waveform, accuracy of the acquired value is lower.

SUMMARY

A piezoelectric drive device according to an application example of the present disclosure includes a vibrating part that drives a driven member by vibration, and a control unit that controls the vibration of the vibrating part, wherein the vibrating part includes a piezoelectric material having a first surface and a second surface in a front-back relation, a drive electrode having a first electrode arranged at the first surface and a second electrode arranged at the second surface, and vibrating the piezoelectric material when a drive signal from the control unit is input to the second electrode, and a detection electrode having a third electrode arranged at the first surface and a fourth electrode arranged at the second surface, and outputting a detection signal according to the vibration of the piezoelectric material to the control unit via the fourth electrode, and the first electrode and the third electrode are separated on the first surface, and the second electrode and the fourth electrode are separated on the second surface.

DESCRIPTION OF EXEMPLARY EMBODIMENTS

As below, preferred embodiments of a piezoelectric drive device, robot, and printer of the present disclosure will be explained in detail according to the accompanying drawings.

First Embodiment

Figure 1:
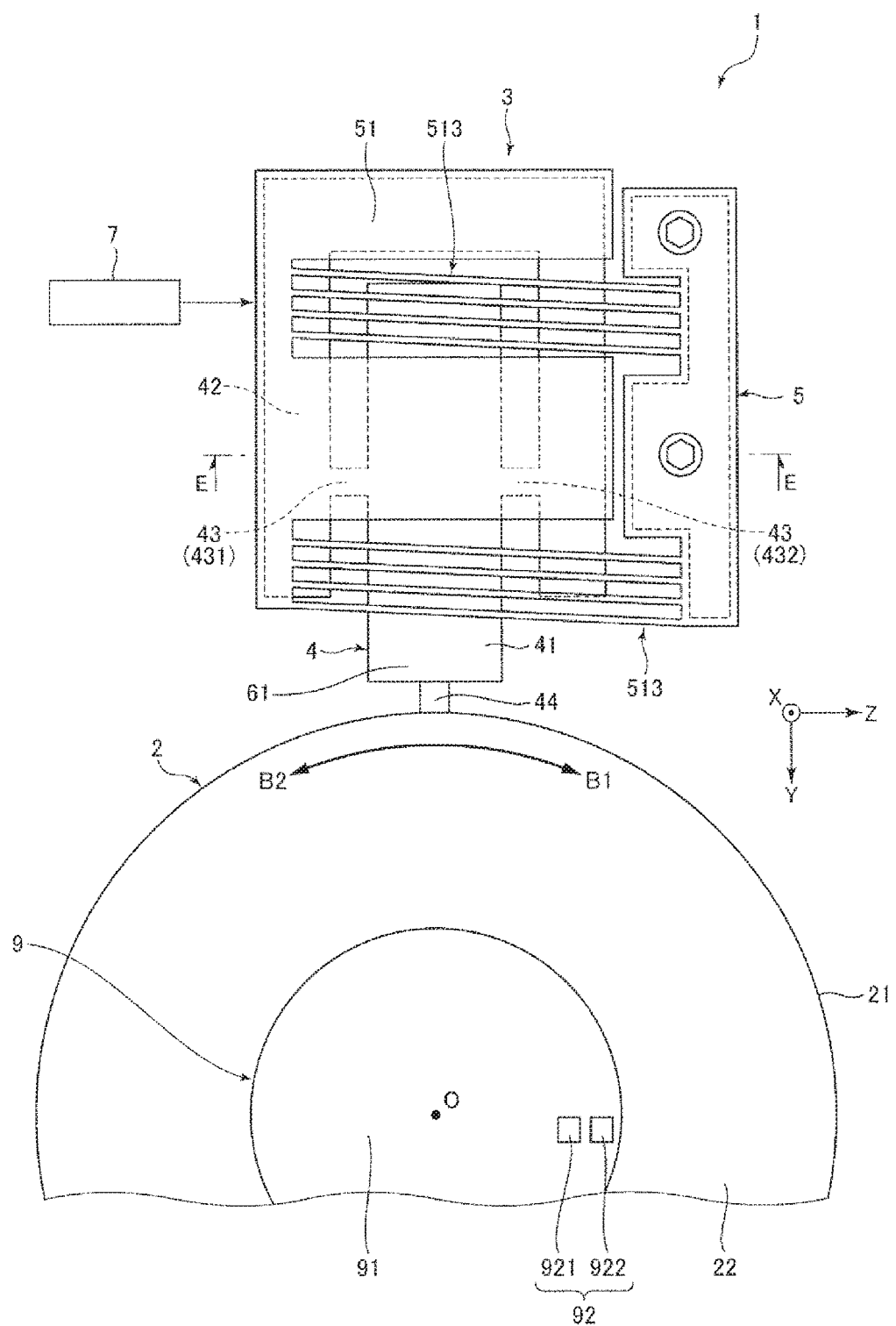
FIG. 1 is a plan view showing a piezoelectric motor according to a first embodiment of the present disclosure.
Figure 2:
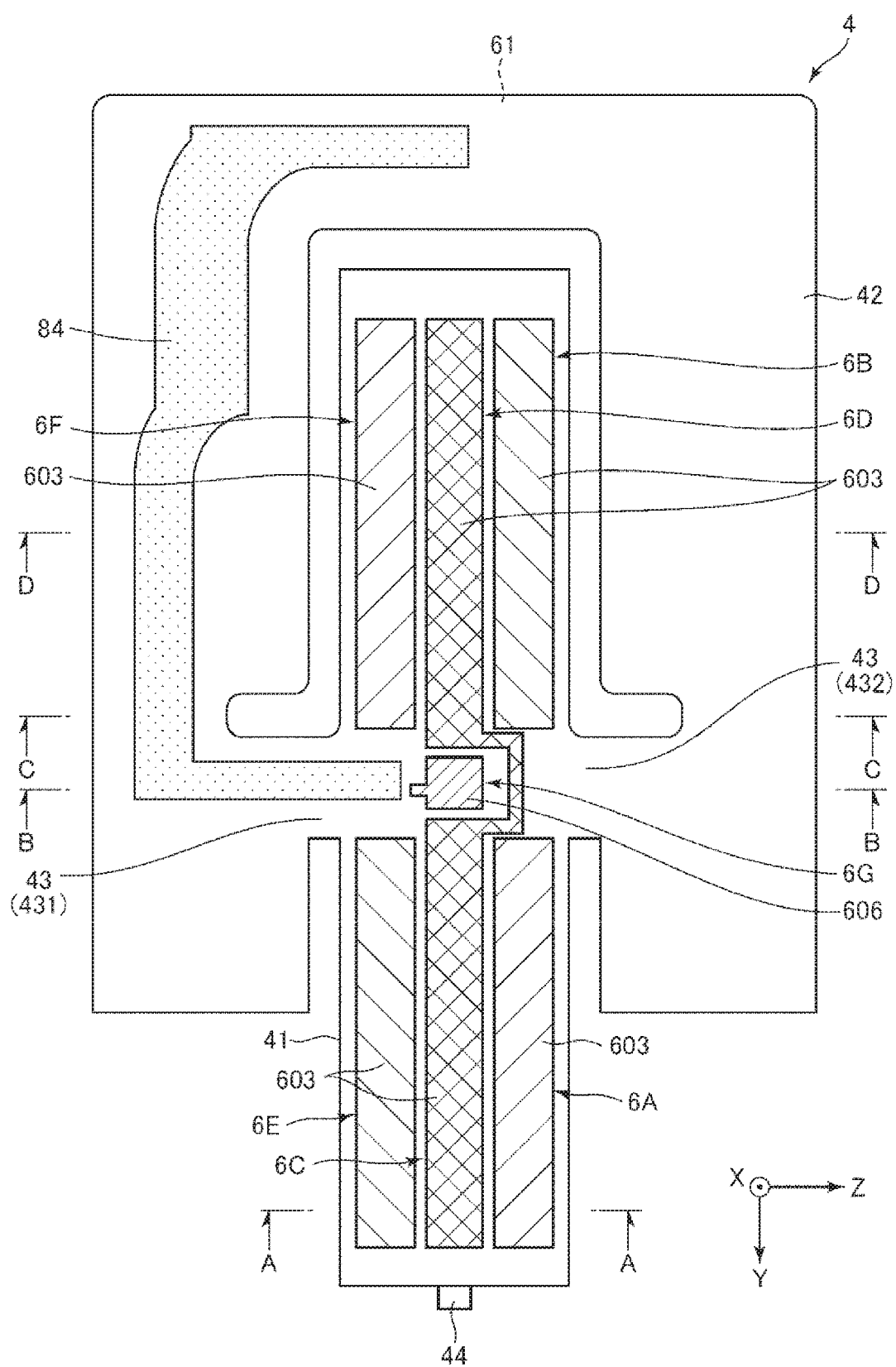
FIG. 2 is a plan view showing an arrangement of electrodes of a piezoelectric actuator contained in the piezoelectric motor shown in FIG. 1.
Figure 3:
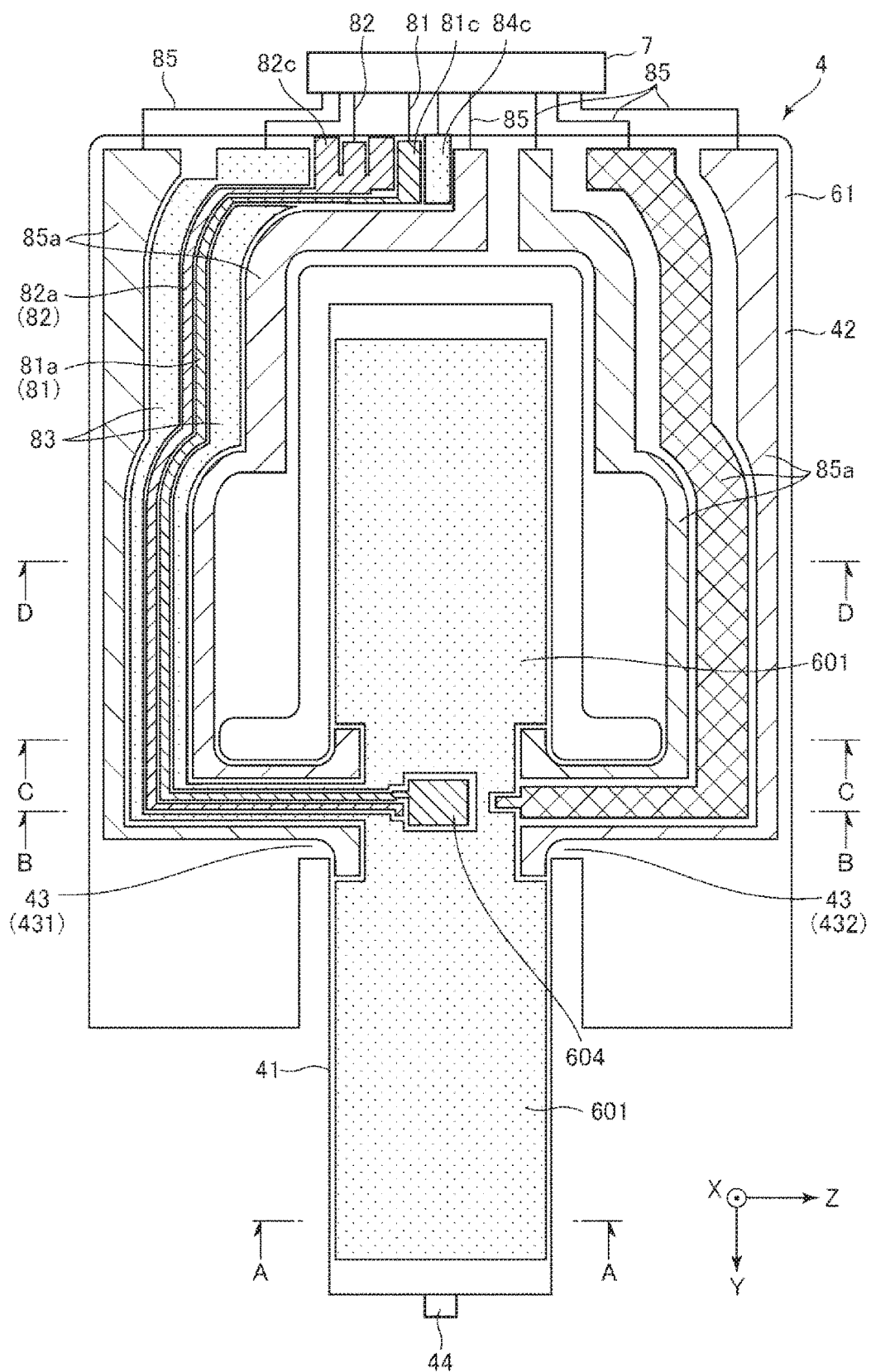
FIG. 3 is a plan view showing an arrangement of wires of the piezoelectric actuator contained in the piezoelectric motor shown in FIG. 1.
Figure 4:
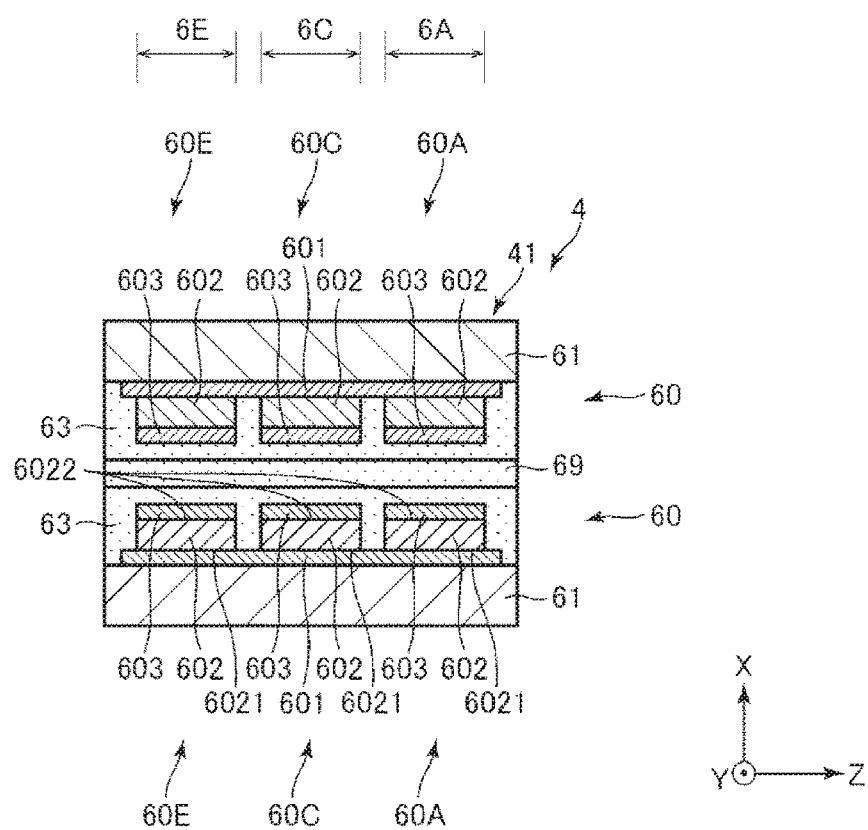
FIG. 4 is a sectional view along line A-A in FIG. 3.
Figure 5:
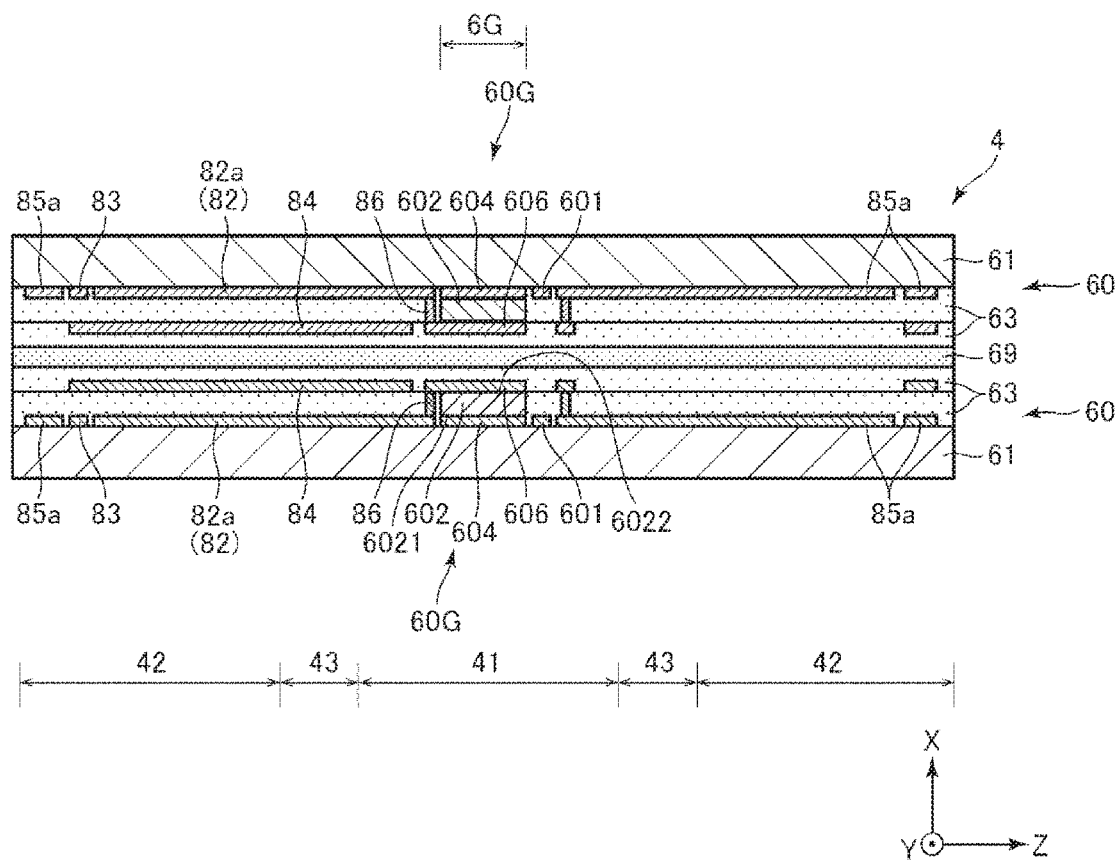
FIG. 5 is a sectional view along line B-B in FIG. 3.
Figure 6:
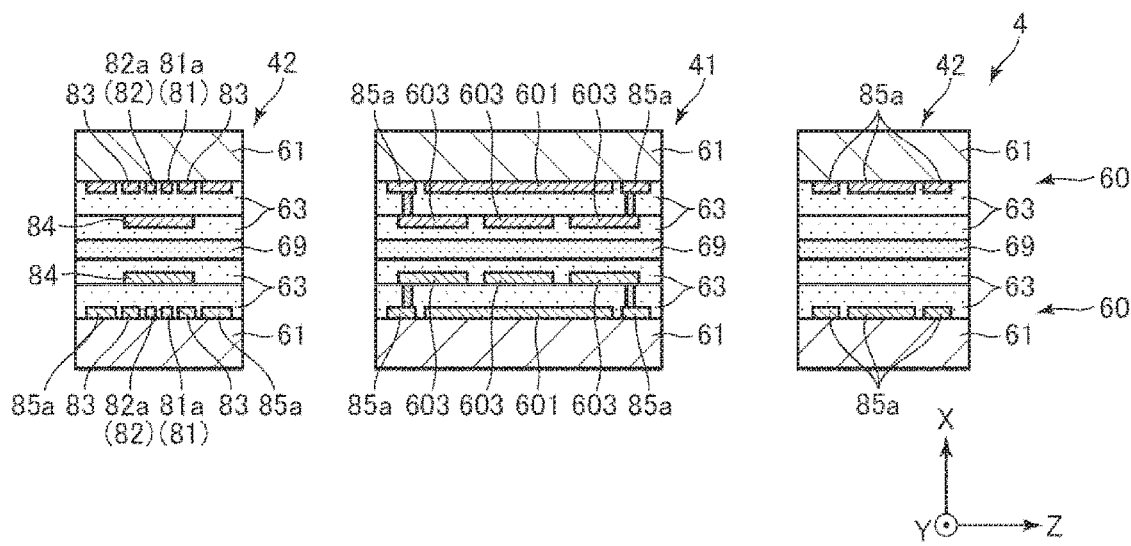
FIG. 6 is a sectional view along line C-C in FIG. 3.
Figure 7:
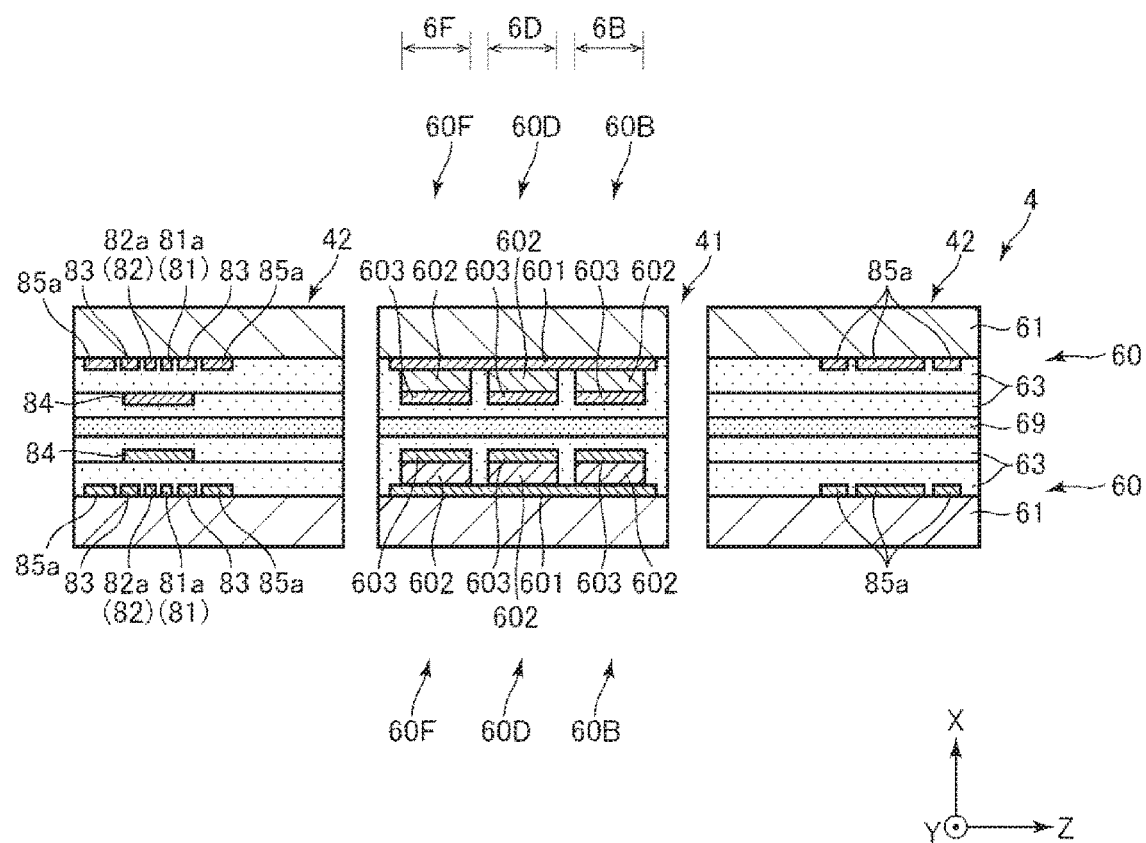
FIG. 7 is a sectional view along line D-D in FIG. 3.
Figure 8:
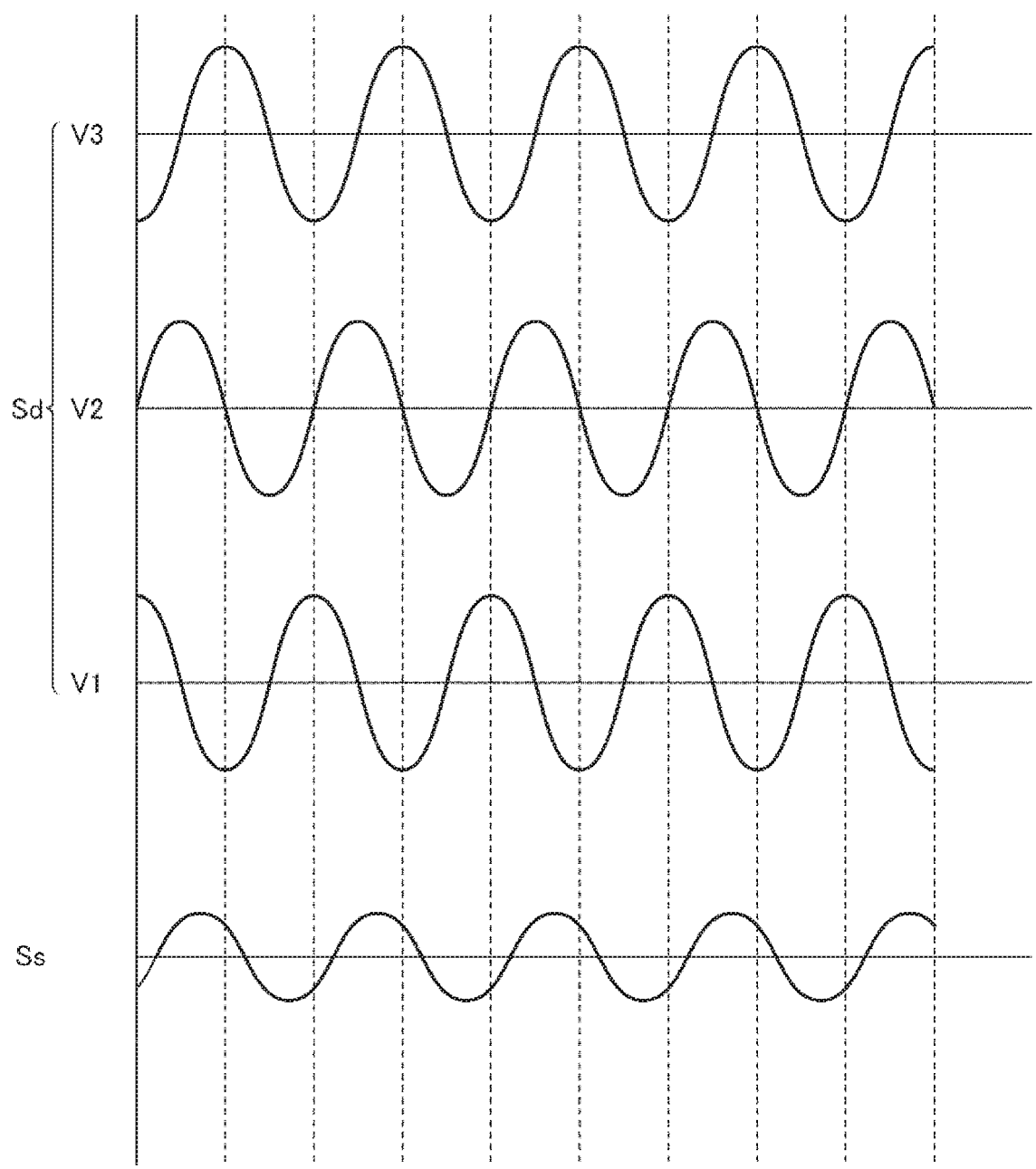
FIG. 8 shows alternating-current voltages applied to the piezoelectric actuator shown in FIG. 2.
Figure 9:
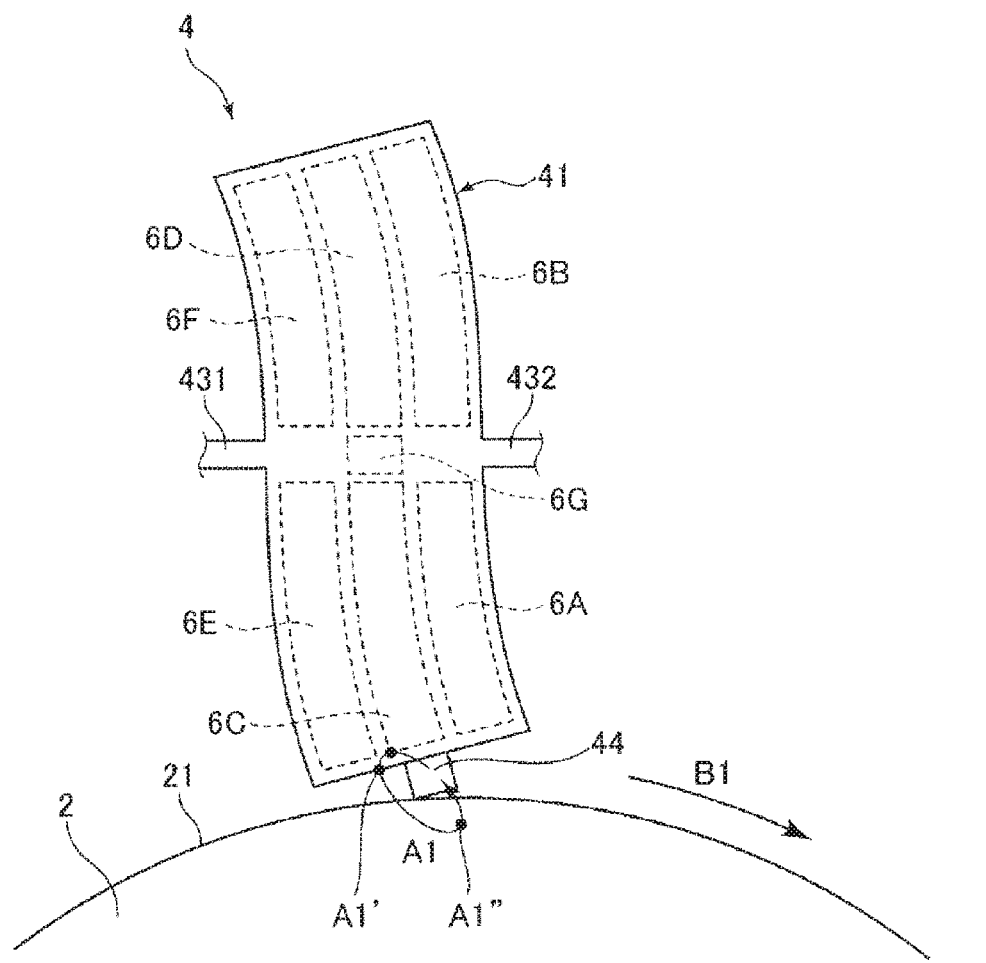
FIG. 9 is a plan view showing a drive state of the piezoelectric motor shown in FIG. 1.
Figure 10:
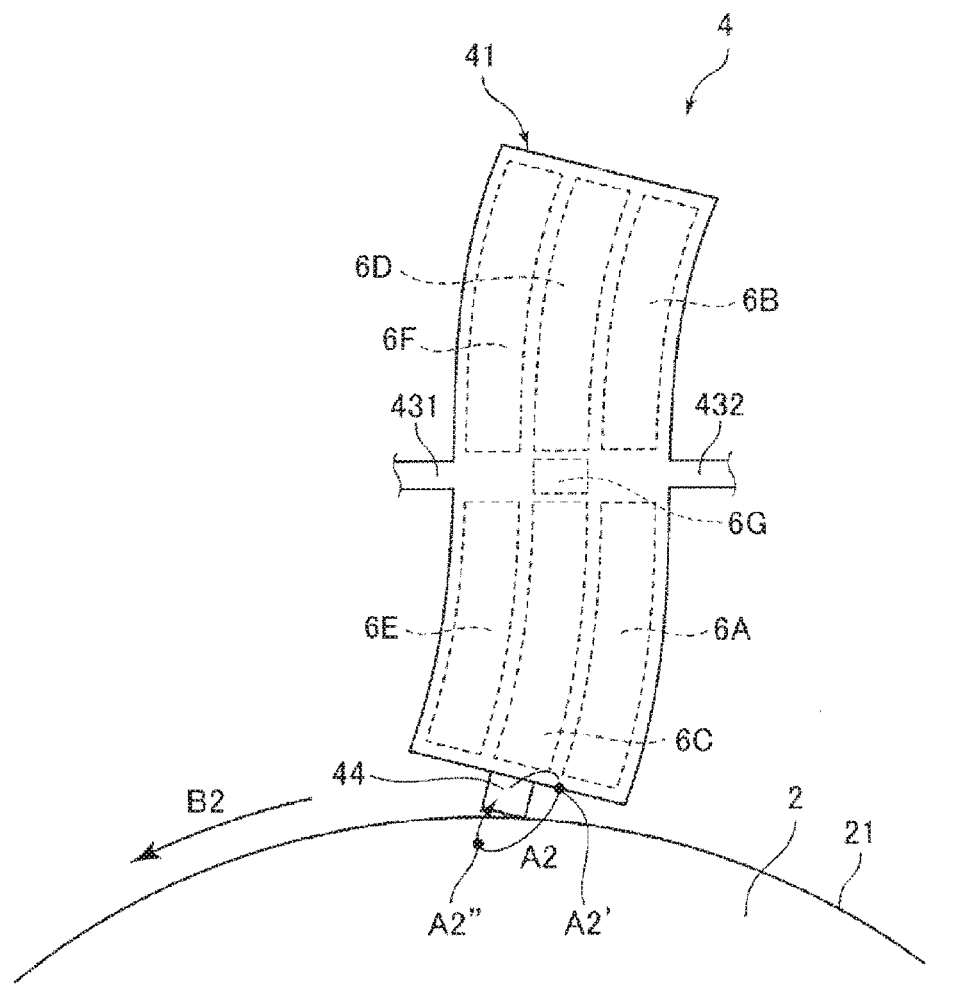
FIG. 10 is a plan view showing a drive state of the piezoelectric motor shown in FIG. 1.
Figure 11:
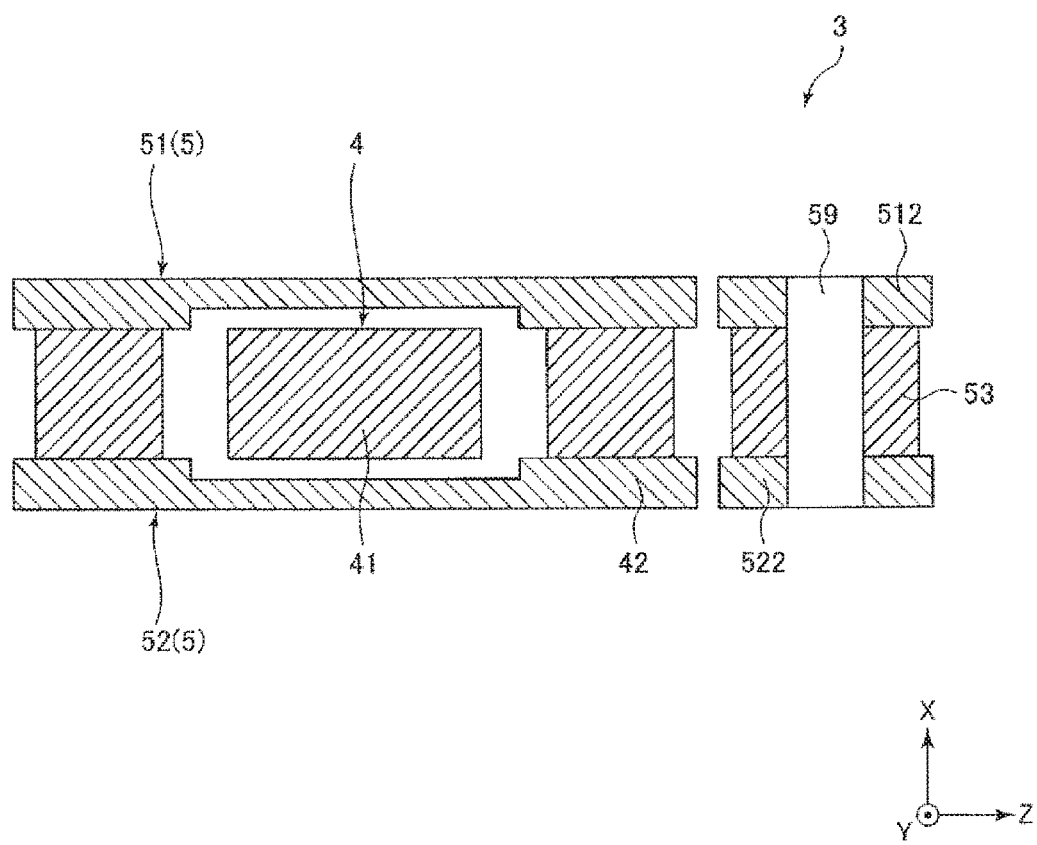
FIG. 11 is a sectional view along line E-E in FIG. 1.

FIG. 1 is the plan view showing the piezoelectric motor according to the first embodiment of the present disclosure. FIG. 2 is the plan view showing the arrangement of electrodes of the piezoelectric actuator contained in the piezoelectric motor shown in FIG. 1. FIG. 3 is the plan view showing the arrangement of wires of the piezoelectric actuator contained in the piezoelectric motor shown in FIG. 1. FIG. 4 is the sectional view along line A-A in FIG. 3. FIG. 5 is the sectional view along line B-B in FIG. 3. FIG. 6 is the sectional view along line C-C in FIG. 3. FIG. 7 is the sectional view along line D-D in FIG. 3. FIG. 8 shows alternating-current voltages applied to the piezoelectric actuator shown in FIG. 2. FIG. 9 and FIG. 10 are respectively the plan views showing the drive state of the piezoelectric motor shown in FIG. 1. FIG. 11 is the sectional view along line E-E in FIG. 1.

Note that, hereinafter, for convenience of explanation, three axes orthogonal to one another are referred to as "X-axis", "Y-axis", and "Z-axis", and a direction along the X-axis is also referred to as "X-axis direction", a direction along the Y-axis is also referred to as "Y-axis direction", and a direction along the Z-axis is also referred to as "Z-axis direction". Further, the pointer sides of the respective axes are also referred to as "plus sides" and the opposite sides to the pointer sides are also referred to as "minus sides". Furthermore, the plus side in the X-axis direction is also referred to as "upper" or "upside" and the minus side in the X-axis direction is also referred to as "lower" or "downside".

The piezoelectric motor 1 shown in FIG. 1 has a rotor 2 as a driven member having a circular disk shape and being rotatable about a center axis O thereof and a piezoelectric drive device 3 in contact with an outer circumferential surface 21 of the rotor 2. In the piezoelectric motor 1, when the piezoelectric drive device is flexurally vibrated, the rotor 2 rotates about the center axis O parallel to the X-axis. Note that the configuration of the piezoelectric motor 1 is not limited to the configuration in FIG. 1. For example, a plurality of the piezoelectric drive devices 3 may be placed along the circumferential direction of the rotor 2 and the rotor may be rotated by driving of the plurality of piezoelectric drive devices 3. Further, the piezoelectric drive device 3 may be in contact with a principal surface of the rotor 2, not with the outer circumferential surface 21 of the rotor 2. The driven member is not limited to a rotor such as the rotor 2, but may be e.g. a slider that linearly moves.

In the embodiment, an encoder 9 is provided in the rotor 2 and the encoder 9 may detect the behavior of the rotor 2, particularly, an amount of rotation and an angular velocity. The encoder 9 is not particularly limited, but may be e.g. an incremental encoder that detects the amount of rotation when the rotor 2 rotates or an absolute encoder that detects an absolute position of the rotor 2 from the origin regardless of whether the rotor 2 rotates or not.

The encoder 9 of the embodiment has a scale 91 fixed to the upper surface of the rotor 2 and an optical element 92 provided at the upside of the scale 91. The scale 91 has a circular plate shape and has a pattern (not shown) provided on the upper surface thereof. On the other hand, the optical element 92 has a light emitting device 921 that radiates light toward the pattern of the scale 91 and an imaging device 922 that captures the pattern of the scale 91. In the encoder 9 having the above described configuration, the amount of rotation, drive velocity, absolute position, etc. of the rotor 2 may be detected by template matching of the image of the pattern acquired by the imaging device 922. Note that the configuration of the encoder 9 is not limited to the above described configuration. For example, in place of the imaging device 922, a configuration including a light receiving device that receives reflected light or transmitted light from the scale 91 may be employed.

The piezoelectric drive device 3 has a piezoelectric actuator 4 as a vibrating part, an urging member 5 that urges the piezoelectric actuator 4 toward the rotor 2, and a controller 7 as a control unit that controls driving of the piezoelectric actuator 4.

As shown in FIG. 2, the piezoelectric actuator 4 has a vibrator 41, a supporting portion 42 supporting the vibrator 41, a coupling portion 43 coupling the vibrator 41 and the supporting portion 42, and a convex portion 44 coupled to the vibrator 41 and transmitting the vibration of the vibrator 41 to the rotor 2.

The vibrator 41 has a plate shape in a thickness direction along the X-axis direction and spreading on a Y-Z plane containing the Y-axis and the Z-axis, and flexurally vibrates in S-shapes by stretching in the Y-axis direction and flexing in the Z-axis direction. Further, the vibrator has a longitudinal shape elongated in the Y-axis direction as the stretching direction in plan view from the X-axis direction. Note that the shape of the vibrator 41 is not particularly limited as long as the vibrator may fulfill the function thereof.

As shown in FIG. 2, the vibrator 41 has driving piezoelectric elements 6A to 6F for flexural vibration of the vibrator 41 and a detection piezoelectric element 6G for detecting vibration of the vibrator 41.

The piezoelectric elements 6C, 6D are placed along the longitudinal direction (Y-axis direction) of the vibrator 41 in the center part of the vibrator 41 in the Z-axis direction. The piezoelectric element 6C is located closer to the plus side in the Y-axis direction than the piezoelectric element 6D, and the piezoelectric element 6D is located closer to the minus side in the Y-axis direction than the piezoelectric element 6C. The piezoelectric element 6G is placed between the piezoelectric element 6C and the piezoelectric element 6D. The piezoelectric element 6C and the piezoelectric element 6D are electrically coupled to each other.

Note that, in place of the two piezoelectric elements 6C, 6D, a single piezoelectric element may be provided.

The piezoelectric elements 6A, 6B are placed adjacent to each other in the longitudinal direction of the vibrator 41 at the plus side of the vibrator 41 in the Z-axis direction with respect to the piezoelectric elements 6C, 6D, and the piezoelectric elements 6E, 6F are placed adjacent to each other in the longitudinal direction of the vibrator 41 at the minus side in the Z-axis direction. These piezoelectric elements 6A to 6F respectively stretch in the longitudinal direction of the vibrator 41 (Y-axis direction) by energization. The piezoelectric elements 6A, 6F are electrically coupled to each other and the piezoelectric elements 6B, 6E are electrically coupled to each other. As will be described later, alternating-current voltages in different phases at the same frequency are respectively applied to the piezoelectric elements 6C, 6D, the piezoelectric elements 6A, 6F, and the piezoelectric elements 6B, 6E and the stretching times of the elements are shifted, and thereby, the vibrator 41 may be flexurally vibrated in S-shapes within the plane thereof.

The piezoelectric element 6G is located between the piezoelectric element 6C and the piezoelectric element 6D. That is, the piezoelectric element 6G is placed adjacent to the piezoelectric elements 6C, 6D in the stretching direction thereof (Y-axis direction). An external force according to the vibration of the vibrator 41 with driving of the piezoelectric elements 6A to 6F is applied to the piezoelectric element 6G, and the piezoelectric element 6G outputs a signal according to the applied external force. Accordingly, the vibration state of the vibrator 41 may be sensed based on the signal output from the piezoelectric element 6G. Note that "the piezoelectric element 6G is placed adjacent to the piezoelectric elements 6C, 6D in the stretching direction thereof" means that at least a part of the piezoelectric element 6G is located within an area in which an area formed by extension of the piezoelectric element 6C in the stretching direction (Y-axis direction) and an area formed by extension of the piezoelectric element 6D in the stretching direction (Y-axis direction) overlap, and preferably means that the entire of the piezoelectric element 6G is located within the area.

Further, the piezoelectric element 6G is placed in a part as a node of the flexural vibration of the vibrator 41. The node of the flexural vibration is a part in which the amplitude in the Z-axis direction is substantially zero, i.e. a part in which the flexural vibration is not substantially generated. As described above, the piezoelectric element 6G is placed adjacent to the piezoelectric elements 6C, 6D in the stretching direction thereof (Y-axis direction) and placed in the part containing the node of the flexural vibration of the vibrator 41, and thereby, the stretching vibration of the vibrator 41 in the Y-axis direction is easier to be transmitted to the piezoelectric element 6G and the flexural vibration of the vibrator 41 in the Z-axis direction is harder to be transmitted. That is, sensitivity for the flexural vibration may be made lower while sensitivity for the stretching vibration is made higher. Accordingly, the stretching vibration of the vibrator 41 in the Y-axis direction may be detected with higher accuracy by the piezoelectric element 6G.

Note that the placement of the piezoelectric element 6G is not particularly limited as long as the element may detect the stretching vibration of the vibrator 41 in the Y-axis direction, but may be placed in a part as an antinode of the flexural vibration of the vibrator 41, for example. Or, the piezoelectric element 6G may be divided into a plurality of pieces.

The supporting portion 42 supports the vibrator 41. The supporting portion 42 has a U-shape surrounding the proximal end side (the minus side in the Y-axis direction) of the vibrator 41 in the plan view from the X-axis direction. Note that the shape and the placement of the supporting portion 42 are not particularly limited as long as the portion may fulfill the function thereof.

The coupling portion 43 couples the part as the node of the flexural vibration of the vibrator 41, specifically, the center part of the vibrator 41 in the Y-axis direction and the supporting portion 42. The coupling portion 43 has a first coupling part 431 located at the minus side in the Z-axis direction with respect to the vibrator 41 and a second coupling part 432 located at the plus side in the Z-axis direction. Note that the configuration of the coupling portion 43 is not particularly limited as long as the portion may fulfill the function thereof.

The above described vibrator 41, supporting portion 42, and coupling portion 43 have a configuration formed by bonding of two piezoelectric element units 60 to face each other as shown in FIGS. 4 to 7. That is, in the sectional views shown in FIGS. 4 to 7, the configurations of the piezoelectric element units 60 have a mirror-image relationship with respect to a line passing through the midpoint of the configurations. Each piezoelectric element unit 60 has a substrate 61, driving piezoelectric elements 60A, 60B, 60C, 60D, 60E, 60F and detection piezoelectric element 60G arranged at the substrate 61, and a protective layer 63 covering the respective piezoelectric elements 60A to 60G. The protective layer 63 has an insulation property and may be referred to as "insulating part". The substrate 61 is not particularly limited, but e.g. a silicon substrate may be used. In the following description, of the two piezoelectric element units 60 shown in FIGS. 4 to 7, the piezoelectric element unit 60 located at the downside in the respective drawings will be representatively explained.

As shown in FIG. 4, each of the piezoelectric elements 60A to 60F has a first electrode 601 arranged at the substrate 61, a piezoelectric material 602 arranged at the first electrode 601, and a second electrode 603 arranged at the piezoelectric material 602. The first electrodes 601, the piezoelectric materials 602, and the second electrodes 603 are respectively individually provided in the piezoelectric elements 60A to 60F. That is, the first electrodes 601 and the second electrodes 603 are driving electrodes that vibrate the respective piezoelectric materials 602 of the driving piezoelectric elements 60A to 60F based on drive signals.

On the other hand, as shown in FIG. 5, the piezoelectric element 60G has a third electrode 604 arranged at the substrate 61, a piezoelectric material 602 arranged at the third electrode 604, and a fourth electrode 606 arranged at the piezoelectric material 602. The third electrode 604 is provided individually from the first electrodes 601 and the fourth electrode 606 is provided individually from the second electrodes 603. That is, the third electrode 604 and the fourth electrode 606 are detection electrodes that output detection signals according to the vibration of the piezoelectric material 602 of the detection piezoelectric element 60G to the controller 7, which will be described later.

The two piezoelectric element units 60 are joined via an adhesive 69 with the surfaces on which the piezoelectric elements 60A to 60G are placed facing each other. Note that the piezoelectric element unit 60 may be singly used. The number of units to be bonded is not limited to two, but may be three or more.

The first electrodes 601 of the respective piezoelectric elements 60A are electrically coupled via wires or the like (not shown). Further, the second electrodes 603 of the respective piezoelectric elements 60A are electrically coupled via wires or the like (not shown). These two piezoelectric elements 60A form the piezoelectric element 6A. The same applies to the other piezoelectric elements 60B to 60F, and the two piezoelectric elements 60B form the piezoelectric element 6B, the two piezoelectric elements 60C form the piezoelectric element 6C, the two piezoelectric elements 60D form the piezoelectric element 6D, the two piezoelectric elements 60E form the piezoelectric element 6E, and the two piezoelectric elements 60F form the piezoelectric element 6F.

On the other hand, the third electrodes 604 of the respective piezoelectric elements 60G are electrically coupled via wires or the like (not shown). Further, the fourth electrodes 606 of the respective piezoelectric elements 60G are electrically coupled via wires or the like (not shown). These two piezoelectric elements 60G form the piezoelectric element 6G.

The constituent material of the piezoelectric material 602 is not particularly limited, but piezoelectric ceramics including e.g. lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead scandium niobate, etc. may be used. Or, as the piezoelectric material 602, polyvinylidene fluoride, crystal quartz, or the like may be used in addition to the above described piezoelectric ceramics.

The method of forming the piezoelectric material 602 is not particularly limited, but the material may be formed from a bulk material or formed using the sol-gel method or sputtering method. In the embodiment, the piezoelectric material 602 is formed using the sol-gel method. Thereby, for example, the thinner piezoelectric material 602 is obtained compared to the case where the material is formed from the bulk material, and the thickness of the piezoelectric drive device 3 may be reduced.

The convex portion 44 is provided in the distal end part of the vibrator 41 and projects from the vibrator 41 toward the plus side in the Y-axis direction. The distal end part of the convex portion 44 is in contact with the outer circumferential surface 21 of the rotor 2. Accordingly, the vibration of the vibrator 41 is transmitted to the rotor 2 via the convex portion 44. The constituent material of the convex portion 44 is not particularly limited to, but includes various kinds of ceramics such as zirconia, alumina, and titania. Thereby, the convex portion 44 with better durability is obtained.

In the piezoelectric actuator 4, when an alternating-current voltage V1 shown in FIG. 8 is applied to the piezoelectric elements 6A, 6F, an alternating-current voltage V2 is applied to the piezoelectric elements 6C, 6D, and an alternating-current voltage V3 is applied to the piezoelectric elements 6B, 6E, as shown in FIG. 9, the vibrator 41 flexurally vibrates in S-shapes in the Z-axis direction while stretchingly vibrating in the Y-axis direction, and these vibrations are synthesized and the distal end of the convex portion 44 makes elliptic motion (rotary motion) drawing an elliptical trajectory counterclockwise as shown by an arrow A1. Therefore, the alternating-current voltages V1, V2, V3 are drive signals Sd in the piezoelectric drive device 3. The rotor 2 is sent out by the elliptic motion of the convex portion 44, and the rotor 2 rotates clockwise as shown by an arrow B1. In response to the vibration of the vibrator 41, a detection signal Ss is output from the piezoelectric element 6G.

Note that, in the elliptic motion of the convex portion 44 shown by the arrow A1, the convex portion 44 is in contact with the outer circumferential surface 21 of the rotor 2 and sends out the rotor 2 in the direction of the arrow B1 from a point A1' to a point A1", and the convex portion 44 is separated from the outer circumferential surface 21 of the rotor 2 from the point A1" to the point A1'. Accordingly, the rotation of the rotor 2 toward the opposite side to the arrow B1 is suppressed.

When the alternating-current voltages V1, V3 are switched, that is, when the alternating-current voltage V1 is applied to the piezoelectric elements 6B, 6E, the alternating-current voltage V2 is applied to the piezoelectric elements 6C, 6D, and the alternating-current voltage V3 is applied to the piezoelectric elements 6A, 6F, as shown in FIG. 10, the vibrator 41 flexurally vibrates in S-shapes in the Z-axis direction while stretchingly vibrating in the Y-axis direction, and these vibrations are synthesized and the convex portion 44 makes elliptic motion clockwise as shown by an arrow A2. The rotor 2 is sent out by the elliptic motion of the convex portion 44, and the rotor 2 rotates counterclockwise as shown by an arrow B2. In response to the vibration of the vibrator 41, the detection signal Ss is output from the piezoelectric element 6G.

Note that, in the elliptic motion of the convex portion 44 shown by the arrow A2, the convex portion 44 is in contact with the outer circumferential surface 21 of the rotor 2 and sends out the rotor 2 in the direction of the arrow B2 from a point A2' to a point A2", and the convex portion 44 is separated from the outer circumferential surface 21 of the rotor 2 from the point A2" to the point A2'. Accordingly, the rotation of the rotor 2 toward the opposite side to the arrow B2 is suppressed.

In the embodiment, the patterns of the alternating-current voltages applied to the piezoelectric elements 6A to 6F are not particularly limited as long as the rotor 2 may be rotated at least in one direction. Or, the voltages applied to the piezoelectric elements 6A to 6F may be e.g. direct-current voltages to be intermittently applied, not the alternating-current voltages.

It is only necessary that the convex portion 44 is provided as appropriate, and another member may be substituted for the convex portion.

The urging member 5 is a member that urges the convex portion 44 toward the outer circumferential surface 21 of the rotor 2. As shown in FIG. 11, the urging member 5 has a first substrate 51 located at the upper surface side (the plus side in the X-axis direction) of the piezoelectric actuator 4 and a second substrate 52 located at the lower surface side (the minus side in the X-axis direction) of the piezoelectric actuator 4. The piezoelectric actuator 4 is sandwiched by the first substrate 51 and the second substrate 52. The first substrate 51 and the second substrate 52 are not particularly limited, but e.g. silicon substrates may be used.

Here, in the embodiment, the single piezoelectric actuator 4 is sandwiched by the first substrate 51 and the second substrate 52, however, for example, a configuration in which a stacking structure formed by stacking of a plurality of piezoelectric actuators 4 is sandwiched by the first substrate 51 and the second substrate 52 may be used. Thereby, the number of piezoelectric actuators 4 contained in the single piezoelectric drive device 3 increases, and the rotor 2 may be rotated with greater torque by the increase.

As shown in FIG. 11, a spacer 53 having an equal thickness to that of the piezoelectric actuator 4 is provided between supporting portions 512, 522. Further, in the part, a through hole 59 penetrating in the X-axis direction is formed, and the urging member 5 is fastened by a screw to a housing or the like using the through hole 59. The urging member 5 is fastened to a housing or the like with a spring portion 513 bent in the Y-axis direction, and thereby, the convex portion 44 may be urged toward the outer circumferential surface 21 of the rotor 2 using the restoring force of the spring portion 513.

As above, the urging member 5 is explained, however, the configuration of the urging member 5 is not particularly limited as long as the member may urge the convex portion 44 toward the outer circumferential surface 21 of the rotor 2. For example, one of the first substrate and the second substrate 52 may be omitted. Or, for example, a coil spring, plate spring, or the like may be used as the urging member 5.

The controller 7 applies the alternating-current voltages V1, V2, V3 to the piezoelectric elements 6A to 6F, and thereby, controls driving of the piezoelectric drive device 3.

Figure 12:
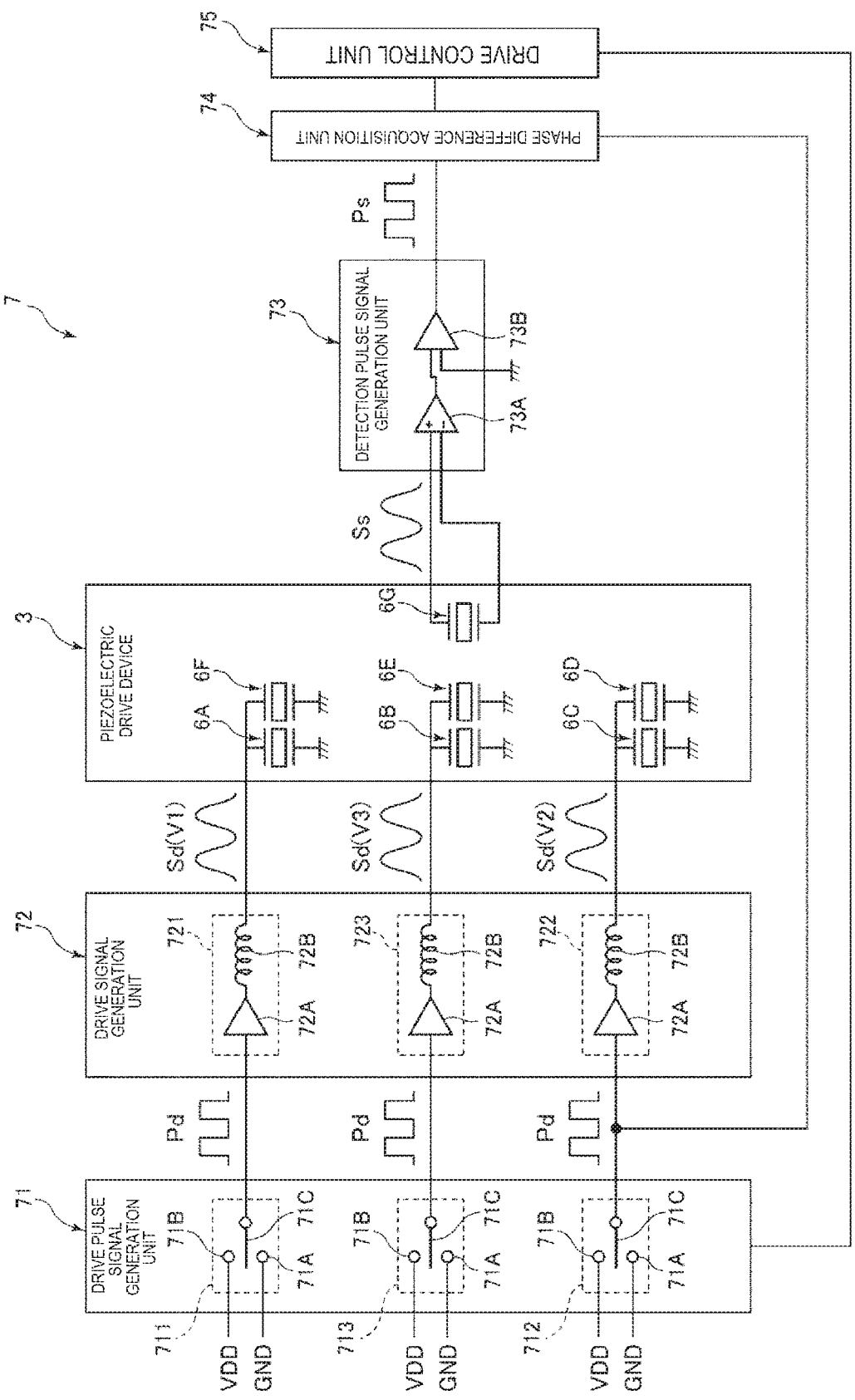
FIG. 12 is a circuit diagram showing a controller shown in FIGS. 1 and 3.

FIG. 12 is the circuit diagram showing the controller shown in FIGS. 1 and 3.

As shown in FIG. 12, the controller 7 has a drive pulse signal generation unit 71 that generates drive pulse signals Pd, a drive signal generation unit 72 that generates the drive signals Sd applied to the piezoelectric elements 6A, 6B, 6C, 6D, 6E, 6F from the drive pulse signals Pd, a detection pulse signal generation unit 73 that generates a detection pulse signal Ps by binarization of the detection signal Ss output from the piezoelectric element 6G, a phase difference acquisition unit 74 that acquires phase differences between the drive pulse signals Pd and the detection pulse signal Ps, and a drive control unit 75 that controls driving of the drive pulse signal generation unit 71 based on the phase differences.

The drive pulse signal generation unit 71 is a circuit that generates the drive pulse signals Pd (digital signals) for generation of the drive signals Sd. As shown in FIG. 12, the drive pulse signals Pd generated in the drive pulse signal generation unit 71 have rectangular waves binarized at High and Low. The drive pulse signal generation unit 71 may change Duties of the drive pulse signals Pd. The Duties of the drive pulse signals Pd are changed, and thereby, amplitude of the drive signals Sd may be changed. For example, when the Duty is 50%, the amplitude of the drive signal Sd is the maximum and, as the Duty is made closer to 0%, the amplitude of the drive signal Sd decreases.

Note that the configuration of the drive pulse signal generation unit 71 is not particularly limited as long as the unit may generate the above described drive pulse signals Pd and change the Duties of the drive pulse signals Pd. As shown in FIG. 12, the drive pulse signal generation unit 71 of the embodiment has electrodes 71A at potentials of GND, electrodes 71B at potentials of +VDD, and switching elements 71C, and is configured to generate the drive pulse signals Pd by alternately switching states in which the electrodes 71A and the switching elements 71C are coupled and states in which the electrodes 71B and the switching elements 71C are coupled. Further, in the embodiment, the drive pulse signal generation unit 71 has a first drive pulse signal part 711, a second drive pulse signal part 712, and a third drive pulse signal part 713 for generation of different three drive signals, e.g. the alternating-current voltages V1, V2, V3 and signals in different phases.

The drive signal generation unit 72 is a circuit that generates the drive signals Sd as analog signals from the drive pulse signals Pd generated in the drive pulse signal generation unit 71. As shown in FIG. 12, the drive signals Sd generated in the drive signal generation unit 72 are nearly sinusoidal wave signals.

Note that the configuration of the drive signal generation unit 72 is not particularly limited as long as the unit may generate the above described drive signals Sd. As shown in FIG. 12, the drive signal generation unit 72 of the embodiment mainly includes buffers 72A and coils 72B. Further, in the embodiment, the drive signal generation unit 72 has a first drive signal part 721 coupled to the first drive pulse signal part 711, a second drive signal part 722 coupled to the second drive pulse signal part 712, and a third drive signal part 723 coupled to the third drive pulse signal part 713 for generation of different three drive signals, e.g. the alternating-current voltages V1, V2, V3 and signals in different phases.

The three drive signals generated by the drive signal generation unit 72, here, the alternating-current voltages V1, V2, V3 are applied to the piezoelectric elements 6A, 6B, 6C, 6D, 6E, 6F, and thereby, as described above, the vibrator 41 flexurally vibrates and the rotor 2 rotates with the vibration.

The detection pulse signal generation unit 73 is a circuit that generates the detection pulse signal Ps as a digital signal by binarizing the detection signal Ss as an analog signal output from the piezoelectric element 6G with the flexural vibration of the vibrator 41. As shown in FIG. 12, the detection signal Ss output from the piezoelectric element 6G is a nearly sinusoidal wave signal corresponding to the amplitude of the vibrator 41, and the detection pulse signal Ps is a rectangular wave signal formed by binarization of the detection signal Ss at High and Low. Note that the configuration of the detection pulse signal generation unit 73 is not particularly limited as long as the unit may generate the above described detection pulse signal Ps. As shown in FIG. 12, the detection pulse signal generation unit 73 of the embodiment has a differential amplifier 73A and a comparator 73B.

The phase difference acquisition unit 74 is a circuit that acquires the phase differences between the drive pulse signals Pd and the detection pulse signal Ps. As described above, the phase differences are acquired, and thereby, the vibration state of the vibrator 41 may be monitored.

The drive control unit 75 is a circuit that controls driving of the drive pulse signal generation unit 71 based on the phase differences acquired by the phase difference acquisition unit 74. The drive control unit 75 changes the frequencies of the respective drive pulse signals Pd as needed so that the phase differences may track a predetermined value. The amplitude of the vibrator 41 and the phase differences have correlations and the phase differences are set to values at which the amplitude of the vibrator 41 takes the maximum value, and thereby, the rotor 2 may be rotated at a higher speed.

In the above described manner, driving of the piezoelectric drive device 3 may be controlled.

Figure 13:
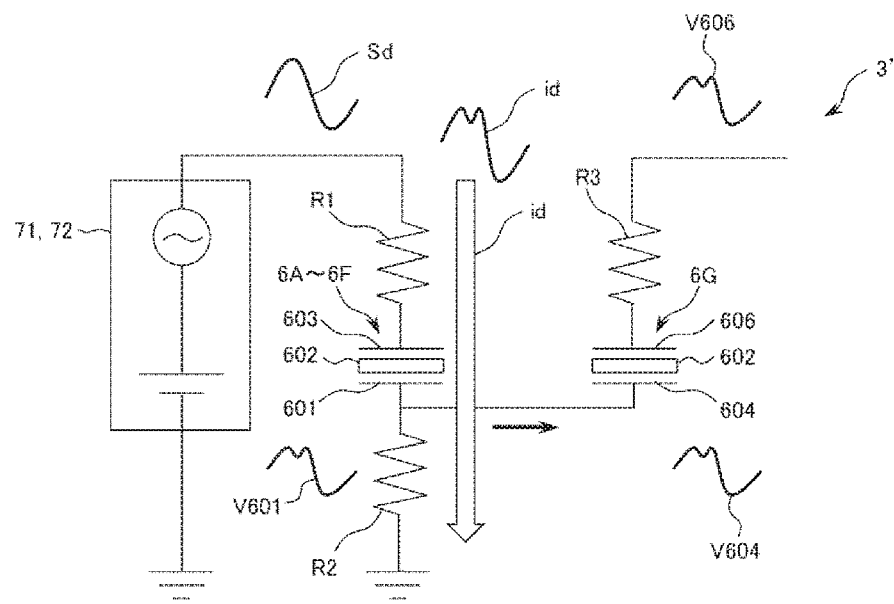
FIG. 13 schematically shows a circuit contained in a piezoelectric drive device of a related art.

Here, FIG. 13 schematically shows the circuit contained in the piezoelectric drive device of the related art. For convenience of explanation, the same signs as those in FIG. 2 are used in FIG. 13.

In a piezoelectric drive device 3' of the related art shown in FIG. 13, each of the driving piezoelectric elements 6A to 6F has the first electrode 601 and the second electrode 603 as described above. The first electrode 601 is coupled to GND (reference potential). The second electrode 603 is electrically coupled to the drive pulse signal generation unit 71 and the drive signal generation unit 72.

Further, the detection piezoelectric element 6G shown in FIG. 13 has the third electrode 604 and the fourth electrode 606 as described above. The third electrode 604 and the first electrode 601 are electrically coupled. That is, in the circuit of the related art, the first electrodes 601 of the driving piezoelectric elements 6A to 6F and the third electrode 604 of the detection piezoelectric element 6G are the common electrodes. Further, the fourth electrode 606 is electrically coupled to the detection pulse signal generation unit.

Internal resistances R1 exist in the wires connecting the drive signal generation unit 72 and the piezoelectric elements 6A to 6F or the like. Similarly, internal resistances R2 exist in the wires coupling the piezoelectric elements 6A to 6F and GND or the like. Further, an internal resistance R3 exists in the wire coupling the piezoelectric element 6G and the detection pulse signal generation unit 73 or the like.

When the piezoelectric drive device 3' of the related art is driven, e.g. drive signals Sd having nearly sinusoidal voltage waveforms are input from the drive signal generation unit 72 to the driving piezoelectric elements 6A to 6F. When the drive signals Sd are input, currents id according to the voltage waveforms of the drive signals Sd flow between the first electrodes 601 and the second electrodes 603 of the driving piezoelectric elements 6A to 6F.

However, noise components of a higher order than that of the drive signals Sd are superimposed on the currents id due to influences by parasitic capacitances of the wires that change with time and vibrations of the piezoelectric elements 6A to 6F. That is, the current id has a waveform with the harmonic noise component superimposed on the nearly sinusoidal waveform. When the current id flows in the internal resistance R2, a potential difference with the current id multiplied by a resistance value is produced between the ends of the internal resistance R2. Therefore, the waveform of a potential V601 of the first electrode 601 is a waveform on which the waveform of the current id with the noise component superimposed thereon is reflected.

Further, in the piezoelectric drive device 3' of the related art, as described above, the first electrodes 601 and the third electrode 604 are electrically coupled. Accordingly, the waveform of a potential V604 of the third electrode 604 is a waveform substantially equal to the waveform of the potential V601 of the first electrodes 601. That is, the noise components superimposed on the potentials V601 in the driving piezoelectric elements 6A to 6F transition to the potential V604 without change.

When the piezoelectric materials 602 are deformed by the potentials V603 of the second electrodes 603 of the piezoelectric elements 6A to 6F and the vibrator 41 vibrates, electric charge according to the vibration is generated in the fourth electrode 606 of the piezoelectric element 6G. Therefore, the waveform of a potential V606 of the fourth electrode 606 of the piezoelectric element 6G is a waveform containing a component on which the vibration of the vibrator 41 is reflected, i.e., a signal component.

Here, when a current flows between the third electrode 604 and the fourth electrode 606 of the detection piezoelectric element 6G, the noise component superimposed on the potential V604 transitions to the potential V606 of the fourth electrode 606. As a result, the waveform of the potential V606 is a waveform on which not only the signal component based on the vibration of the vibrator 41 but also the noise component is superimposed. For convenience of explanation, the waveform of the potential V606 shown in FIG. 13 is illustrated as a waveform with the signal component subtracted therefrom, i.e., a waveform showing the noise component only.

In the above described piezoelectric drive device 3' of the related art, the waveform of the potential V606 with the noise component superimposed thereon is input to the comparator and a detection pulse signal is generated. Accordingly, in the piezoelectric drive device 3' of the related art, the detection pulse signal is generated based on the potential V606 containing the noise component and driving of the piezoelectric drive device 3' is controlled based on the signal. Accordingly, in the piezoelectric drive device 3' of the related art, it is harder to accurately control the driving thereof.

Figure 14:
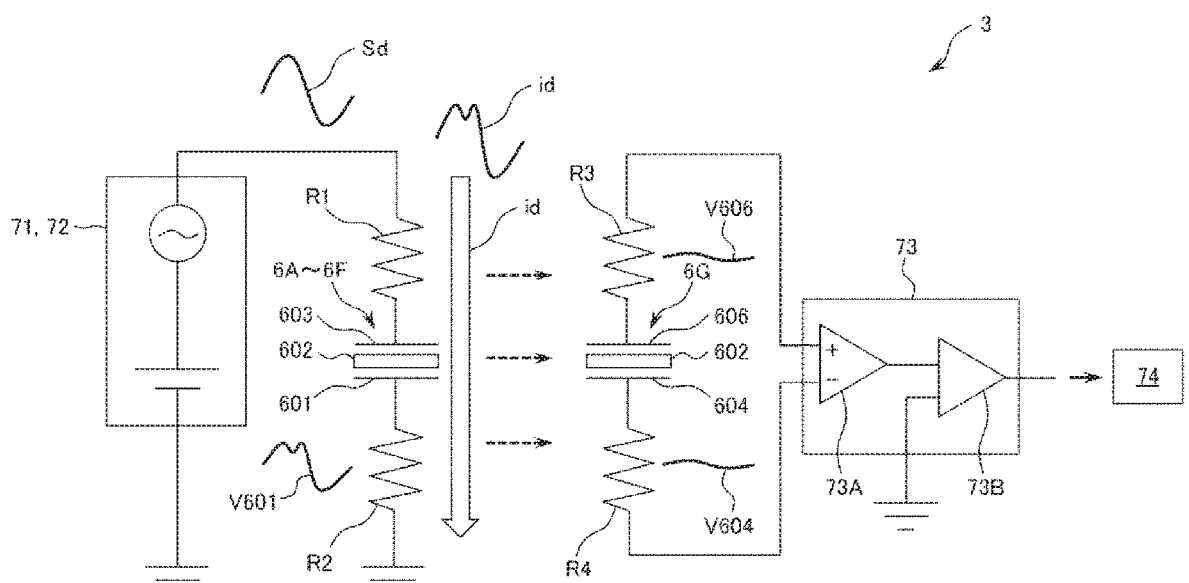
FIG. 14 schematically shows a circuit contained in a piezoelectric drive device according to the embodiment.

On the other hand, FIG. 14 schematically shows the circuit contained in the piezoelectric drive device according to the embodiment. In the following description, the explanation will be made with a focus on differences from the piezoelectric drive device 3' of the related art shown in FIG. 13 and the explanation of the same items will be omitted.

In the piezoelectric drive device 3 shown in FIG. 14, as described above, the third electrode 604 is provided individually from the first electrodes 601. That is, the first electrodes 601 and the third electrode 604 are respectively arranged at lower surfaces 6021 (first surfaces) of the piezoelectric materials 602 shown in FIGS. 4 and 5 and separated from each other on the lower surfaces 6021.

On the other hand, as described above, the fourth electrode 606 is provided individually from the second electrodes 603. The second electrodes 603 and the fourth electrode 606 are respectively arranged at upper surfaces 6022 (second surfaces) of the piezoelectric materials 602 shown in FIGS. 4 and 5 and separated from each other on the upper surfaces 6022. Here, "separated" refers to a state not coupled via conductors of wires or the like. In the embodiment, the first electrodes 601 and third electrode 604 and the second electrodes 603 and fourth electrode 606 are respectively coupled via non-conductors of the substrate 61 etc.

The third electrode 604 is coupled to a negative input terminal of the differential amplifier 73A. The fourth electrode 606 is coupled to a positive input terminal of the differential amplifier 73A. Note that the above described internal resistance R3 exists in the wire connecting the fourth electrode 606 of the piezoelectric element 6G and the differential amplifier 73A or the like, however, an internal resistance R4 also exists in the wire connecting the third electrode 604 and the differential amplifier 73A or the like.

In the above described piezoelectric drive device according to the embodiment, the drive signals Sd are input from the drive signal generation unit 72 to the second electrodes 603 of the driving piezoelectric elements 6A to 6F. When the drive signals Sd are input, the currents id having the waveforms according to the voltage waveforms of the drive signals Sd flow between the first electrodes 601 and the second electrodes 603 of the driving piezoelectric elements 6A to 6F.

However, as described above, the noise components of a higher order than that of the drive signals Sd are superimposed on the currents id due to influences by parasitic capacitances of the wires that change with time and vibrations of the piezoelectric elements 6A to 6F. When the current id flows in the internal resistance R2, the potential difference with the current id multiplied by the resistance value is produced between the ends of the internal resistance R2. Therefore, the waveform of the potential V601 at the first electrode 601 side is the waveform on which the waveform of the current id with the noise component superimposed thereon is reflected. In this regard, in the piezoelectric drive device 3' of the related art, the third electrode 604 of the detection piezoelectric element 6G and the first electrodes 601 are common, and the potential V604 of the third electrode 604 is equal to the potentials V601. Further, the noise component superimposed on the potential V604 transitions to the potential V606 of the fourth electrode 606. Accordingly, the waveform of the potential V606 on which the noise components of the potentials V601 are superimposed without substantial attenuation is obtained.

Here, in the piezoelectric drive device 3 according to the embodiment shown in FIG. 14, as described above, the third electrode 604 is provided individually from the first electrodes 601. Accordingly, the waveforms of the potentials V601 of the first electrode 601 basically do not transition to the waveform of the potential V604 of the third electrode 604 without change. Note that, as described above, the first electrodes 601 and the third electrode 604 are structurally connected via the substrate 61 etc., and the first electrodes 601 and the third electrode 604 may be electrically coupled. In this case, the noise components contained in the waveform of the potentials V601 are attenuated and superimposed on the potential V604. Therefore, the waveform of the potential V604 of the third electrode 604 is a waveform containing the attenuated noise components.

The noise components superimposed on the potential V604 also transition to the potential V606 of the fourth electrode 606. As a result, the waveform of the potential V606 is a waveform on which not only the signal component based on the vibration of the vibrator 41 but also the attenuated noise components are superimposed. For convenience of explanation, the waveform of the potential V606 shown in FIG. 14 is illustrated as a waveform with the signal component subtracted therefrom, i.e., a waveform showing the noise component only.

In the above described piezoelectric drive device 3, the waveform of the detection signal Ss containing the waveform of the potential V606 of the fourth electrode 606 is the waveform containing the noise component, but the noise component is attenuated compared to that of the related art. Accordingly, the detection signal Ss is extracted from the fourth electrode 606 as a signal with higher accuracy. Then, the detection signal Ss is output to the controller 7 via the fourth electrode 606. Therefore, in the detection pulse signal generation unit 73, when the detection pulse signal Ps is generated from the detection signal Ss, the detection pulse signal Ps with high accuracy is generated. In the phase difference acquisition unit 74, the phase difference between the drive pulse signals Pd and the detection pulse signal Ps may be acquired with higher accuracy. As a result, driving of the drive pulse signal generation unit 71 may be controlled more precisely and driving of the piezoelectric drive device 3 may be stably controlled.

The above described piezoelectric drive device 3 has the piezoelectric actuator 4 (vibrating part) that drives the rotor 2 (driven member) by vibration, and the controller 7 (control unit) that controls the vibration of the piezoelectric actuator 4. The piezoelectric actuator 4 includes the piezoelectric materials 602 having the lower surfaces 6021 (first surfaces) and the upper surfaces 6022 (second surfaces) in front-back relations, the drive electrodes having the first electrodes 601 arranged at the lower surfaces 6021 and the second electrodes 603 arranged at the upper surfaces 6022, and vibrating the piezoelectric materials 602 when the drive signals Sd from the controller 7 are input to the second electrodes 603, and the detection electrode having the third electrode 604 arranged at the lower surface 6021 and the fourth electrode 606 arranged at the upper surface 6022, and outputting the detection signal Ss according to the vibrations of the piezoelectric materials 602 to the controller 7 (control unit). Further, the first electrodes 601 and the third electrode 604 are separated on the lower surface 6021, and the second electrodes 603 and the fourth electrode 606 are separated from each other on the upper surface 6022.

According to the piezoelectric drive device 3, the detection signal Ss with high accuracy may be acquired. Accordingly, the piezoelectric drive device 3 that can stably drive may be realized.

As described above, the controller 7 (control unit) has the differential amplifier 73A contained in the detection pulse signal generation unit 73. Further, the potential V606 of the fourth electrode 606, i.e., the detection signal Ss extracted from the fourth electrode 606 is input to the positive input terminal of the differential amplifier 73A.

The detection signal Ss contains the signal component with the vibration of the vibrator 41 and the noise components superimposed thereon in the above described route. The noise components cause reduction of the S/N-ratio of the detection signal Ss, and thus, for example, reduce the accuracy when the phase differences between the drive pulse signals Pd and the detection pulse signal Ps are obtained.

On the other hand, the potential V604 of the third electrode 604 is input to the negative input terminal of the differential amplifier 73A. The noise components substantially equal to the noise components superimposed on the detection signal Ss are superimposed on the potential V604.

The differential amplifier 73A suppresses components in the same phase and amplifies components in different phases. Accordingly, the probability that the noise component input to the positive input terminal and the noise component input to the negative input terminal are in the same phase is high, and thus, the components may be selectively attenuated in the differential amplifier 73A. Thereby, in the differential amplifier 73A, the signal component that should be primarily detected may be output with high accuracy and subsequently input to the comparator 73B. As a result, in the differential amplifier 73A, the S/N-ratio of the detection signal Ss may be improved by cancelling out of the noise components, and, in the phase difference acquisition unit 74, the phase of the detection pulse signal Ps may be obtained with high accuracy.

Note that the controller 7 according to the embodiment has the differential amplifier 73A, however, the differential amplifier 73A may be omitted when the noise components are small. Or, the differential amplifier 73A may be replaced by other element, circuit, software, or the like having the equal functions thereto.

To cancel out the noise components by the differential amplifier 73A or the like in the above described manner, it is preferable that electrical characteristics are substantially equal between the route from the third electrode 604 to the differential amplifier 73A and the route from the fourth electrode 606 to the differential amplifier 73A. Thereby, the waveforms of the noise components are easily substantially equal in both routes, and the noise components may be cancelled out and reduced more successfully in the differential amplifier 73A.

Specifically, as shown in FIGS. 2, 3, and 5, the piezoelectric drive device 3 has a first detection wire 81 electrically coupling the third electrode 604 and the controller 7 (control unit), and a second detection wire 82 electrically coupling the fourth electrode 606 and the controller 7. When of the first detection wire 81, a part placed in the piezoelectric actuator 4 (vibrating part) is a first vibrating part wire 81a and, of the second detection wire 82, a part placed in the piezoelectric actuator 4 is a second vibrating part wire 82a, in the piezoelectric drive device 3, as shown in FIGS. 3, 6, and 7, the first vibrating part wire 81a and the second vibrating part wire 82a are placed apart on the substrate 61.

According to the placement, for example, adjustable parameters such as an area of the first vibrating part wire 81a and an area of the second vibrating part wire 82a are controlled, and thereby, electrical characteristics including parasitic capacitances and electric resistances of the first vibrating part wire 81a and the second vibrating part wire 82a may be made substantially equal relatively easily. The parasitic capacitances and electric resistances tend to be larger in the first vibrating part wire 81a and the second vibrating part wire 82a of the first detection wire 81 and the second detection wire 82, and thereby, the entire electrical characteristics of the first detection wire 81 and the second detection wire 82 may be made substantially equal more easily in the above described manner. As a result, in the first detection wire 81 and second detection wire 82, the waveforms of the noise components are harder to shift relative to each other, and the noise components may be cancelled out and reduced more successfully in the differential amplifier 73A.

The fourth electrode 606 and the second vibrating part wire 82a are electrically coupled via a through wire 86 penetrating the protective layer 63.

On the other hand, as shown in FIG. 3, the piezoelectric drive device 3 has drive-side wires 85 electrically coupling the second electrodes 603 and the controller 7. Of the drive-side wires 85, parts placed in the piezoelectric actuator 4 are third vibrating part wires 85a. In the piezoelectric drive device 3, as shown in FIG. 3, the third vibrating part wires 85a are placed from the coupling portion 43 to the supporting portion 42.

The first vibrating part wire 81a and the second vibrating part wire 82a are respectively placed from the supporting portion 42 to the coupling portions 43 of the piezoelectric actuator 4. The first vibrating part wire 81a is coupled to the third electrode 604 and the second vibrating part wire 82a is coupled to the fourth electrode 606.

On the other hand, the piezoelectric drive device 3 according to the embodiment has reference potential wires 83 extending in parallel to the first vibrating part wire 81a and the second vibrating part wire 82a on the substrate 61.

Figure 15:
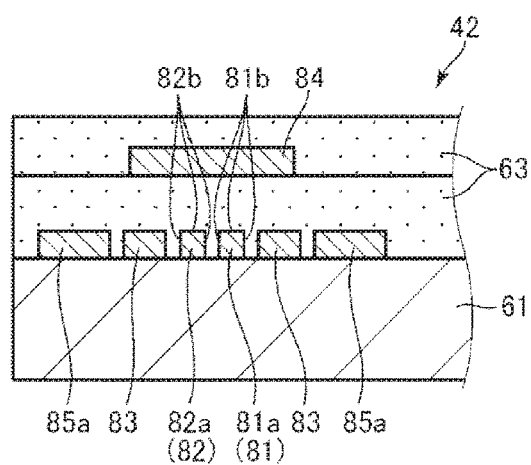
FIG. 15 is a partially enlarged view of a supporting portion shown in FIG. 7.

Further, as shown in FIG. 15, the piezoelectric drive device 3 according to the embodiment has a reference potential wire 84 provided on the protective layer 63 covering the first vibrating part wire 81a and the second vibrating part wire 82a. The reference potential wire 84 is electrically coupled to a terminal 84c provided on the substrate 61 via a wire (not shown).

These reference potential wires 83, 84 are respectively coupled to the reference potential, i.e., the potential of GND.

FIG. 15 is the partially enlarged view of the supporting portion 42 shown in FIG. 7.

In the first vibrating part wire 81a shown in FIG. 15, all of the left surface, the right surface, and the upper surface are side surfaces 81b. Similarly, in the second vibrating part wire 82a shown in FIG. 15, all of the left surface, the right surface, and the upper surface are side surfaces 82b.

In the piezoelectric drive device 3 according to the embodiment, the reference potential wires 83, 84 are placed to overlap with the side surfaces 81b of the first vibrating part wire 81a via the protective layer 63. Similarly, in the piezoelectric drive device 3, the reference potential wires 83, 84 are placed to overlap with the side surfaces 82b of the second vibrating part wire 82a via the protective layer 63.

Specifically, the reference potential wires 83 (a first reference potential wire and a second reference potential wire) are placed to respectively overlap with the left surface and the right surface of the side surfaces 81b shown in FIG. 15. That is, the first vibrating part wire 81a and the second vibrating part wire 82a are placed side by side between the two reference potential wires 83 as the first reference potential wire and the second reference potential wire. Further, the reference potential wire 84 is placed to overlap with the upper surface of the side surfaces 81b shown in FIG. 15.

Similarly, the reference potential wires 83 are placed to respectively overlap with the left surface and the right surface of the side surfaces 82b shown in FIG. 15. Further, the reference potential wire 84 is placed to overlap with the upper surface of the side surfaces 82b shown in FIG. 15.

The reference potential wires 83, 84 are placed as described above, and thereby, in both the first vibrating part wire 81a and the second vibrating part wire 82a, the parasitic capacitances between the reference potential wires 83, 84 and the wires are easily made substantially equal. That is, the reference potential wires 83, 84 are placed to overlap with the side surfaces 81b, 82b, and thereby, the capacitances parasitic in the first vibrating part wire 81a and the second vibrating part wire 82a may be easily forced to be substantially equal. As a result, the electrical characteristics of the first detection wire 81 and the second detection wire 82 are made substantially equal to each other, and the waveforms of the noise components are harder to shift between the wires. Thereby, the noise components may be cancelled out and reduced more successfully in the differential amplifier 73A.

The reference potential wires 83, 84 are placed as described above, and thereby, for example, a function of an electromagnetic shield of suppressing superimposition of noise components induced by electromagnetic wave propagating in the space on the first vibrating part wire 81a and the second vibrating part wire 82a is added. Accordingly, the noise components superimposed in the above described route may be suppressed and the noise components may be reduced more successfully in the differential amplifier 73A.

In this case, the reference potential wires 83, 84 are respectively coupled to the reference potential (GND), and thereby, a function of minimizing eddy currents generated in the reference potential wires 83, 84 and suppressing noise components induced by the eddy currents may be added.

Note that a state in which the reference potential wires 83, 84 overlap with the side surfaces 81b, 82b refers to a state in which the reference potential wires 83, 84 are placed via the protective layer 63 to cover at least parts of the side surfaces 81b, 82b in plan view of the side surfaces 81b, 82b. It is preferable that the reference potential wires 83, 84 are placed to cover halves or more of the respective side surfaces 81b, 82b.

The reference potential wires 83 according to the embodiment are placed to overlap with the respective left surfaces and right surfaces of the first vibrating part wire 81a and the second vibrating part wire 82a, however, the wires may be placed to overlap with ones of the surfaces.

The reference potential wire 84 may be provided as necessary or omitted. When the reference potential wire is provided, the reference potential wires 83 may be omitted.

Further, the reference potential wire 84 (third reference potential wire) is placed to overlap with the two reference potential wires 83 (first reference potential wire and second reference potential wire) and the first vibrating part wire 81a and the second vibrating part wire 82a in plan view of the lower surfaces 6021 (first surfaces) of the piezoelectric materials 602.

Thereby, the electrical characteristics of the first detection wire 81 and second detection wire 82 are substantially equal particularly precisely and the waveforms of the noise components are harder to shift relative to each other. As a result, the noise components may be cancelled out and reduced more successfully in the differential amplifier 73A.

Further, the reference potential wires 83, 84 are placed as described above, and thereby, the above described function as the electromagnetic shield is further enhanced. Accordingly, superimposition of the noise components propagating in the space may be suppressed more reliably, and the noise components may be reduced more successfully in the differential amplifier 73A.

In other words, the reference potential wires 83, 84 are placed to overlap with the side surfaces 81b of the first vibrating part wire 81a and the side surfaces 82b of the second vibrating part wire 82a. That is, the reference potential wires 83, 84 are respectively placed in positions surrounding the first vibrating part wire 81a and positions surrounding the second vibrating part wire 82a.

Note that the surrounding positions refer to positions respectively covering at least parts of the three surfaces of the left surface, the right surface, and the upper surface of the first vibrating part wire 81a shown in FIG. 15 and positions respectively covering at least parts of the three surfaces of the left surface, the right surface, and the upper surface of the second vibrating part wire 82a shown in FIG. 15.

From the above described viewpoint, the function as the electromagnetic shield is further enhanced.

The first vibrating part wire 81a and the second vibrating part wire 82a are respectively arranged at the substrate 61 as described above, however, the direction in which the wires are arranged in the embodiment is a width direction of the first vibrating part wire 81a. The first vibrating part wire 81a and the second vibrating part wire 82a are arranged in parallel as described above, and thereby, the numbers and areas of the reference potential wires 83, 84 may be suppressed and, as shown in FIG. 15, the reference potential wires 83, 84 may be placed to overlap with the side surfaces 81b, 82b. Thereby, the piezoelectric actuator 4 may be downsized.

Further, by the arrangement, the distances between the first vibrating part wire 81a and the reference potential wires 83 and the distances between the second vibrating part wire 82a and the reference potential wires 83 may be easily made substantially equal to each other. That is, in the embodiment, the sum of the distances between the first vibrating part wire 81a and the two reference potential wires 83 and the sum of the distances between the second vibrating part wire 82a and the two reference potential wires 83 shown in FIG. 15 may be easily made substantially equal. Thereby, the parasitic capacitance in the first vibrating part wire 81a and the parasitic capacitance in the second vibrating part wire 82a may be made substantially equal and the waveforms of the noise components are harder to shift relative to each other between the first vibrating part wire 81a and the second vibrating part wire 82a. As a result, the noise components may be cancelled out and reduced more successfully in the differential amplifier 73A.

Note that the reference potential wire 83 may be added as appropriate between the first vibrating part wire 81a and the second vibrating part wire 82a.

The length of the first vibrating part wire 81a and the length of the second vibrating part wire 82a may be different from each other, however, the lengths are preferably equal to each other. Thereby, for example, the width of the first vibrating part wire 81a and the width of the second vibrating part wire 82a are made substantially equal, and the electrical characteristics including electric resistances etc. of the first detection wire 81 and the second detection wire 82 may be made substantially equal more easily. As a result, the noise components may be cancelled out and reduced more successfully in the differential amplifier 73A.

Note that a state in which the lengths are substantially equal to each other refers to a state in which, when lengths of line segments passing through the centers of the respective wires are compared, the difference falls within 5% or less of the shorter length.

The constituent materials of the first vibrating part wire 81a and the second vibrating part wire 82a may be different from each other, however, the constituent materials are preferably the same as each other. Note that the constituent materials are not particularly limited to, but include e.g. various metal materials etc.

The first vibrating part wire 81a and the second vibrating part wire 82a may be provided in different positions from each other, however, as shown in FIG. 7, the positions in the X-axis direction of the piezoelectric materials 602 are preferably the same as each other. Specifically, both the first vibrating part wire 81a and the second vibrating part wire 82a are arranged at the same surface of the substrate 61. These conditions are satisfied, and thereby, the electrical characteristics of the first detection wire 81 and second detection wire 82 are substantially equal particularly easily and the waveforms of the noise components are harder to shift relative to each other. As a result, the noise components may be cancelled out and reduced more successfully in the differential amplifier 73A. Further, according to the arrangement, there is an advantage that formation of the first vibrating part wire 81a and the second vibrating part wire 82a is easier.

The piezoelectric actuator 4 according to the embodiment includes the substrate 61, and the piezoelectric materials 602 placed at one surface side of the substrate 61. In this regard, in the piezoelectric actuator 4, the parasitic capacitance between the first vibrating part wire 81a and third electrode 604 and the substrate 61 and the parasitic capacitance between the second vibrating part wire 82a and fourth electrode 606 and the substrate 61 may be different from each other, however, are preferably the same as each other. Thereby, amounts of changes of the noise components that change based on these parasitic capacitances may be suppressed, and the waveforms of the superimposed noise components are harder to shift between the first vibrating part wire 81a and the second vibrating part wire 82a. As a result, the noise components may be cancelled out and reduced more successfully in the differential amplifier 73A.

Note that, to equalize the parasitic capacitance between the first vibrating part wire 81a and third electrode 604 and the substrate 61 and the parasitic capacitance between the second vibrating part wire 82a and fourth electrode 606 and the substrate 61, for example, the area of the first vibrating part wire 81a and the area of the second vibrating part wire 82a may be made substantially equal to each other or the distance between the first vibrating part wire 81a and the substrate 61 and the distance between the second vibrating part wire 82a and the substrate 61 may be made substantially equal to each other. For example, regarding the parts at distances that are harder to be made substantially equal, the areas may be made different to make up the resulting difference in parasitic capacitance. Similarly, regarding the parts having areas that are harder to be substantially equal, the distances may be made different to make up the resulting difference in parasitic capacitance.

In the case of the piezoelectric actuator 4 shown in FIG. 3, the area of a terminal 82c provided in an end part of the second vibrating part wire 82a is larger than the area of the terminal 81c provided in an end part of the first vibrating part wire 81a. As shown in FIG. 5, this is for the situation that the distance between the fourth electrode 606 and the substrate 61 is larger than the distance between the third electrode 604 and the substrate 61. The area of the terminal 82c is made larger than the area of the terminal 81c, and thereby, the parasitic capacitance between the first vibrating part wire 81a and third electrode 604 and the substrate 61 and the parasitic capacitance between the second vibrating part wire 82a and fourth electrode 606 and the substrate 61 may be set to values close to each other and substantially equal, and the noise components may be cancelled out and reduced more successfully in the differential amplifier 73A.

Note that the area of the terminal 82c is appropriately set according to the difference in parasitic capacitance and the area of the terminal 81c, however, as examples, preferably more than 100% and equal to or less than 1000% of the area of the terminal 81c and more preferably from 105% to 800% of the area.

Second Embodiment

Figure 16:
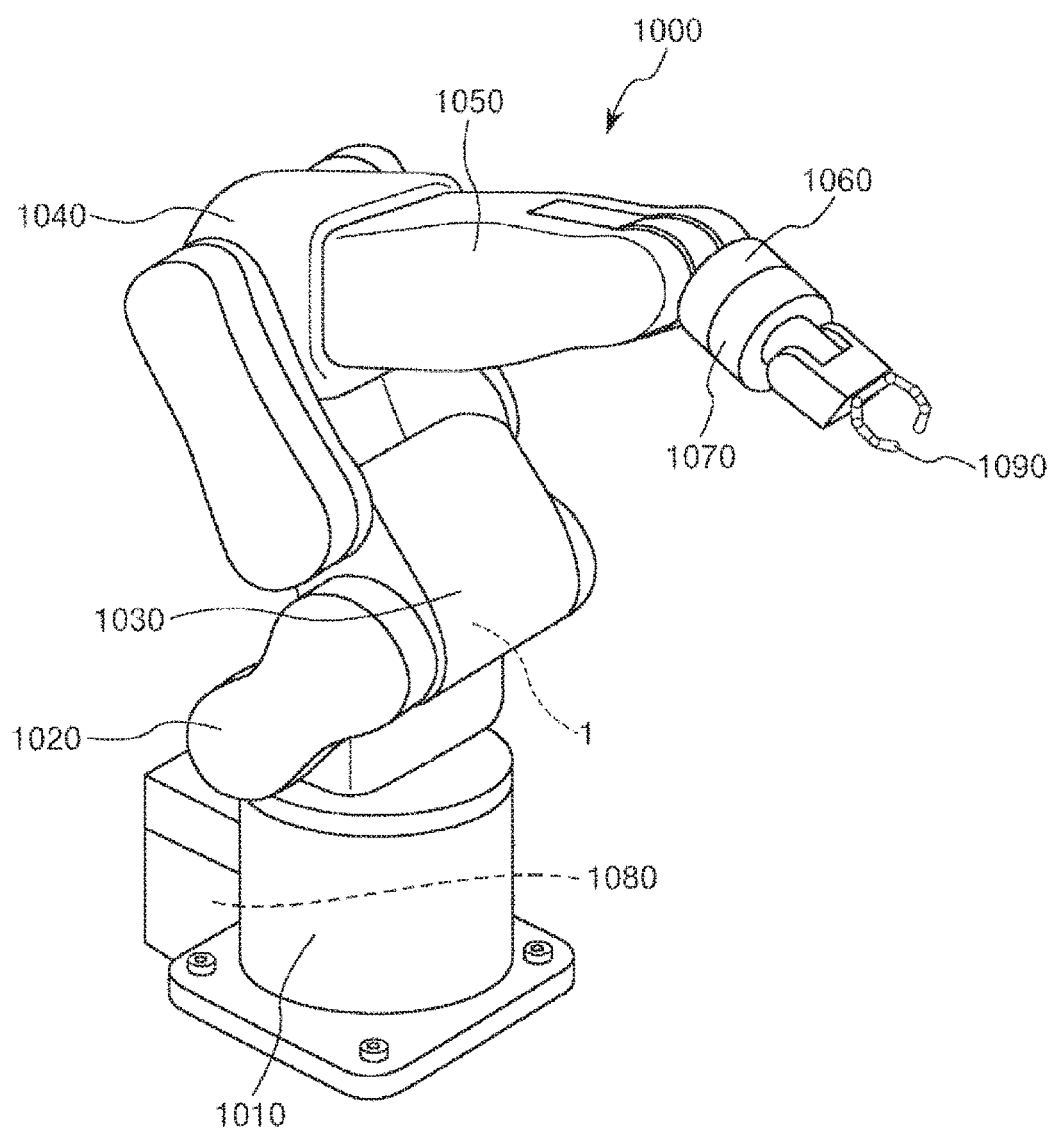
FIG. 16 is a perspective view showing a robot according to a second embodiment of the present disclosure.

FIG. 16 is the perspective view showing the robot according to the second embodiment of the present disclosure.

The robot 1000 shown in FIG. 16 may perform work of feeding, removing, carrying, assembly, etc. of precision apparatuses and components forming the apparatuses. The robot 1000 is a six-axis robot, and has a base 1010 fixed to a floor or ceiling, an arm 1020 pivotably coupled to the base 1010, an arm 1030 pivotably coupled to the arm 1020, an arm 1040 pivotably coupled to the arm 1030, an arm 1050 pivotably coupled to the arm 1040, an arm 1060 pivotably coupled to the arm 1050, an arm 1070 pivotably coupled to the arm 1060, and a control apparatus 1080 that controls driving of these arms 1020, 1030, 1040, 1050, 1060, 1070.

In the arm 1070, a hand coupling part is provided, and an end effector 1090 according to work to be executed by the robot 1000 is attached to the hand coupling part. The piezoelectric motors 1 are mounted on all or part of respective joint parts and the respective arms 1020, 1030, 1040, 1050, 1060, 1070 pivot by driving of the piezoelectric motors 1. Note that the piezoelectric motor 1 may be mounted on the end effector 1090 and used for driving of the end effector 1090.

The control apparatus 1080 includes a computer having e.g. a processor (CPU), memory, I/F (interface), etc. The processor executes predetermined programs (code strings) stored in the memory, and thereby, controls driving of the respective parts of the robot 1000. Note that the programs may be downloaded from an external server via the I/F. All or part of the configurations of the control apparatus 1080 may be provided outside of the robot 1000 and connected via a communication network such as a LAN (local area network).

As described above, the robot 1000 has the piezoelectric motors 1. That is, the robot 1000 includes the piezoelectric drive device 3 having the piezoelectric actuator 4 (vibrating part) and the controller 7 (control unit) that controls the vibration of the piezoelectric actuator 4, and driving the rotor 2 (driven member) in contact with the piezoelectric actuator 4 by vibrating the piezoelectric actuator 4. Of the parts, the piezoelectric actuator 4 includes the piezoelectric materials 602 having the lower surfaces 6021 (first surfaces) and the upper surfaces 6022 (second surfaces) in front-back relations, the drive electrodes having the first electrodes 601 arranged at the lower surfaces 6021 and the second electrodes 603 arranged at the upper surfaces 6022, and vibrating the piezoelectric materials 602 when the drive signals Sd from the controller 7 are input to the second electrodes 603, and the detection electrode having the third electrode 604 arranged at the lower surface 6021 and the fourth electrode 606 arranged at the upper surface 6022, and outputting the detection signal Ss according to the vibrations of the piezoelectric materials 602 to the controller 7 (control unit). Further, the first electrodes 601 and the third electrode 604 are separated on the lower surface 6021, and the second electrodes 603 and the fourth electrode 606 are separated on the upper surface 6022. According to the robot 1000, in the piezoelectric drive device 3, the detection signal Ss with high accuracy may be acquired. Accordingly, the piezoelectric drive device 3 that can stably drive may be realized by driving based on the detection signal Ss. As a result, the robot 1000 that can stably drive may be obtained.

Third Embodiment

Figure 17:
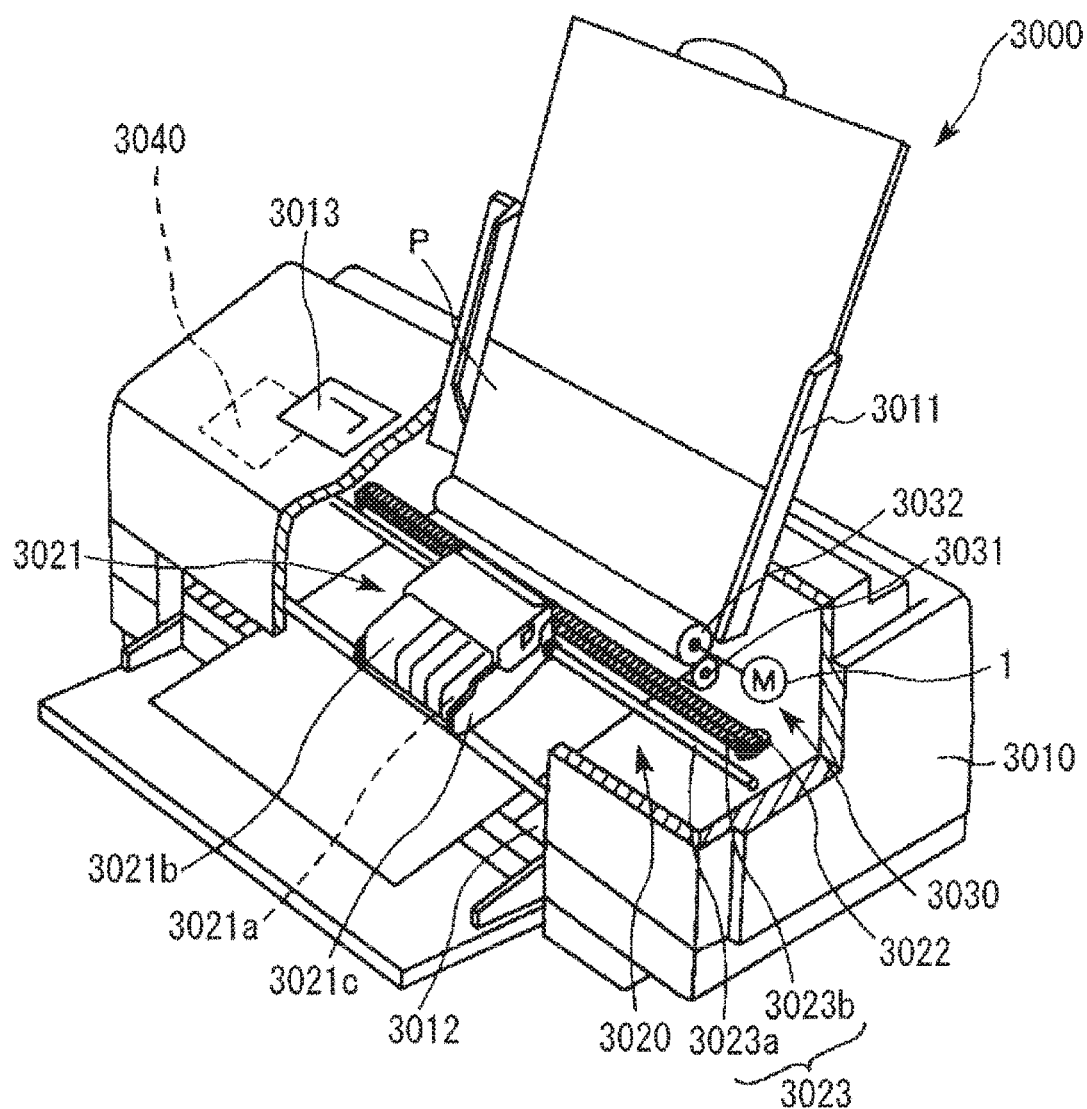
FIG. 17 is a schematic diagram showing an overall configuration of a printer according to a third embodiment of the present disclosure.

FIG. 17 is the schematic diagram showing the overall configuration of the printer according to the third embodiment of the present disclosure.

The printer 3000 shown in FIG. 17 includes an apparatus main body 3010, a printing mechanism 3020 provided inside of the apparatus main body 3010, a paper feed mechanism 3030, and a control apparatus 3040. In the apparatus main body 3010, a tray 3011 in which recording paper P is placed, a paper eject opening 3012 through which the recording paper P is ejected, and an operation panel 3013 of a liquid crystal display or the like are provided.

The printing mechanism 3020 includes a head unit 3021, a carriage motor 3022, and a reciprocation mechanism 3023 that reciprocates the head unit 3021 by drive power of the carriage motor 3022. The head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocably supports the carriage 3021c and a timing belt 3023b that moves the carriage 3021c on the carriage guide shaft 3023a by the drive power of the carriage motor 3022. The paper feed mechanism 3030 has a driven roller 3031 and a driving roller 3032 in press contact with each other, and the piezoelectric motor 1 that drives the driving roller 3032.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

The control apparatus 3040 includes a computer having e.g. a processor (CPU), memory, I/F (interface), etc. The processor executes predetermined programs (code strings) stored in the memory, and thereby, controls driving of the respective parts of the printer 3000. For example, the control is executed based on print data input from a host computer such as a personal computer via the I/F. Note that the programs may be downloaded from an external server via the I/F. All or part of the configurations of the control apparatus 3040 may be provided outside of the printer 3000 and connected via a communication network such as a LAN (local area network).

As described above, the printer 3000 has the piezoelectric motor 1. That is, the printer 3000 includes the piezoelectric drive device 3 having the piezoelectric actuator 4 (vibrating part) and the controller 7 (control unit) that controls the vibration of the piezoelectric actuator 4, and driving the rotor 2 (driven member) in contact with the piezoelectric actuator 4 by vibrating the piezoelectric actuator 4. Of the parts, the piezoelectric actuator 4 includes the piezoelectric materials 602 having the lower surfaces 6021 (first surfaces) and the upper surfaces 6022 (second surfaces) in front-back relations with each other, the drive electrodes having the first electrodes 601 arranged at the lower surfaces 6021 and the second electrodes 603 arranged at the upper surfaces 6022, and vibrating the piezoelectric materials 602 when the drive signals Sd from the controller 7 are input to the second electrodes 603, and the detection electrode having the third electrode 604 arranged at the lower surface 6021 and the fourth electrode 606 arranged at the upper surface 6022, and outputting the detection signal Ss according to the vibrations of the piezoelectric materials 602 to the controller 7 (control unit) via the fourth electrode 606. Further, the first electrodes 601 and the third electrode 604 are separated on the lower surface 6021, and the second electrodes 603 and the fourth electrode 606 are separated on the upper surface 6022. According to the printer 3000, in the piezoelectric drive device 3, the detection signal Ss with high accuracy may be acquired. Accordingly, the piezoelectric drive device 3 that can stably drive may be realized by driving based on the detection signal Ss. As a result, the printer 3000 that can stably drive may be obtained.

Note that, in the embodiment, the piezoelectric motor 1 drives the driving roller 3032 for paper feed, however, may also drive e.g. the carriage 3021c.

As above, the piezoelectric drive device, robot, and printer according to the present disclosure are explained according to the illustrated embodiments, however, the present disclosure is not limited to those. The configurations of the respective parts may be replaced by arbitrary configurations having the same functions. Further, other arbitrary configurations may be added to the present disclosure. Furthermore, the respective embodiments may be combined as appropriate.

What is claimed is:

1. A piezoelectric drive device comprising:
    a vibrating part that drives a driven member by vibration; and
    a control unit that controls the vibration of the vibrating part, wherein
    the vibrating part includes
    a piezoelectric material having a first surface and a second surface in a front-back relation,
    a drive electrode having a first electrode arranged at the first surface and a second electrode arranged at the second surface, and vibrating the piezoelectric material when a drive signal from the control unit is input to the second electrode, and a detection electrode having a third electrode arranged at the first surface and a fourth electrode arranged at the second surface, and outputting a detection signal according to the vibration of the piezoelectric material to the control unit via the fourth electrode, and the first electrode and the third electrode are separated on the first surface, and the second electrode and the fourth electrode are separated on the second surface, the piezoelectric drive device further comprising:

a first detection wire electrically coupling the third electrode and the control unit; and a second detection wire electrically coupling the fourth electrode and the control unit, wherein when a part placed in the vibrating part of the first detection wire is a first vibrating part wire and a part placed in the vibrating part of the second detection wire is a second vibrating part wire, the first vibrating part wire and the second vibrating part wire are placed apart.

2. The piezoelectric drive device according to claim 1, wherein the control unit has a differential amplifier coupled to the first detection wire and the second detection wire.

3. The piezoelectric drive device according to claim 1, further comprising a first reference potential wire and a second reference potential wire coupled to a reference potential, wherein the first vibrating part wire and the second vibrating part wire are placed between the first reference potential wire and the second reference potential wire.

4. The piezoelectric drive device according to claim 3, further comprising a third reference potential wire coupled to the reference potential, wherein the first reference potential wire, second reference potential wire, first vibrating part wire, and second vibrating part wire and the third reference potential wire overlap in plan view of the first surface.

5. The piezoelectric drive device according to claim 1, wherein a length of the first vibrating part wire and a length of the second vibrating part wire are substantially equal.

6. The piezoelectric drive device according to claim 1, wherein the first vibrating part wire and the second vibrating part wire are formed using a same constituent material and arranged at a same surface.

7. The piezoelectric drive device according to claim 1, wherein the vibrating part includes a substrate and the piezoelectric material arranged at one surface of the substrate, and a parasitic capacitance between the first vibrating part wire and third electrode and the substrate and a parasitic capacitance between the second vibrating part wire and fourth electrode and the substrate are the same.

8. A robot comprising a piezoelectric drive device including a vibrating part and a control unit that controls vibration of the vibrating part, and vibrating the vibrating part and driving a driven member in contact with the vibrating part, wherein the vibrating part includes a piezoelectric material having a first surface and a second surface in a front-back relation, a drive electrode having a first electrode arranged at the first surface and a second electrode arranged at the second surface, and vibrating the piezoelectric material when a drive signal from the control unit is input to the second electrode, and a detection electrode having a third electrode arranged at the first surface and a fourth electrode arranged at the second surface, and outputting a detection signal according to the vibration of the piezoelectric material to the control unit via the fourth electrode, and the first electrode and the third electrode are separated on the first surface, and the second electrode and the fourth electrode are separated on the second surface, the piezoelectric drive device further comprising:

a first detection wire electrically coupling the third electrode and the control unit; and a second detection wire electrically coupling the fourth electrode and the control unit, wherein when a part placed in the vibrating part of the first detection wire is a first vibrating part wire and a part placed in the vibrating part of the second detection wire is a second vibrating part wire, the first vibrating part wire and the second vibrating part wire are placed apart.

9. A printer comprising a piezoelectric drive device including a vibrating part and a control unit that controls vibration of the vibrating part, and vibrating the vibrating part and driving a driven member in contact with the vibrating part, wherein the vibrating part includes a piezoelectric material having a first surface and a second surface in a front-back relation, a drive electrode having a first electrode arranged at the first surface and a second electrode arranged at the second surface, and vibrating the piezoelectric material when a drive signal from the control unit is input to the second electrode, and a detection electrode having a third electrode arranged at the first surface and a fourth electrode arranged at the second surface, and outputting a detection signal according to the vibration of the piezoelectric material to the control unit via the fourth electrode, and the first electrode and the third electrode are separated on the first surface, and the second electrode and the fourth electrode are separated on the second surface, the piezoelectric drive device further comprising:

a first detection wire electrically coupling the third electrode and the control unit; and a second detection wire electrically coupling the fourth electrode and the control unit, wherein when a part placed in the vibrating part of the first detection wire is a first vibrating part wire and a part placed in the vibrating part of the second detection wire is a second vibrating part wire, the first vibrating part wire and the second vibrating part wire are placed apart.

* * * * *